(12) United States Patent
Bayram et al.

(10) Patent No.: US 9,362,281 B2
(45) Date of Patent: Jun. 7, 2016

(54) GROUP III NITRIDE INTEGRATION WITH CMOS TECHNOLOGY

(71) Applicant: INTERNATIONAL BUSINESS MACHINES CORPORATION, Armonk, NY (US)

(72) Inventors: Can Bayram, Champaign, IL (US); Christopher Peter D'Emic, Ossining, NY (US); William J. Gallagher, Ardsley, NY (US); Effendi Leobandung, Stormville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/749,004

(22) Filed: Jun. 24, 2015

(65) Prior Publication Data
US 2015/0318276 A1 Nov. 5, 2015

Related U.S. Application Data

(63) Continuation of application No. 14/701,595, filed on May 1, 2015.

(60) Provisional application No. 61/987,705, filed on May 2, 2014.

(51) Int. Cl.
*H01L 27/092* (2006.01)
*H01L 27/06* (2006.01)
(Continued)

(52) U.S. Cl.
CPC .......... *H01L 27/092* (2013.01); *H01L 21/0254* (2013.01); *H01L 21/30604* (2013.01);
(Continued)

(58) Field of Classification Search
CPC ................ H01L 21/02389; H01L 21/2015; H01L 21/8258
USPC .................................. 257/289, 369
See application file for complete search history.

(56) References Cited

U.S. PATENT DOCUMENTS 7,023,055 B2   4/2006 Ieong et al.
7,329,923 B2   2/2008 Doris et al.
(Continued)

OTHER PUBLICATIONS

Kazior, T.E., et al, "High Performance Mixed Signal and RF Circuits Enabled by the Direct Monolithic Heterogeneous Integration of GaN HEMTs and Si CMOS on a Silicon Substrate", Compound Semiconductor Integrated Circuit Symposium (CSICS), 2011 IEEE, Oct. 2011, pp. 1-4.*

*Primary Examiner* — George Fourson, III
(74) *Attorney, Agent, or Firm* — Scully, Scott, Murphy & Presser, P.C.; Louis J. Percello, Esq.

(57) ABSTRACT

A method of forming a structure that can be used to integrate Si-based devices, i.e., nFETs and pFETs, with Group III nitride-based devices is provided. The method includes providing a substrate containing an nFET device region, a pFET device region and a Group III nitride device region, wherein the substrate includes a topmost silicon layer and a <111> silicon layer located beneath the topmost silicon layer. Next, a trench is formed within the Group III nitride device region to expose a sub-surface of the <111> silicon layer. The trench is then partially filled with a Group III nitride base material, wherein the Group III nitride material base material has a topmost surface that is coplanar with, or below, a topmost surface of the topmost silicon layer.

7 Claims, 19 Drawing Sheets

(51) Int. Cl.
  H01L 29/20      (2006.01)
  H01L 29/16      (2006.01)
  H01L 29/778     (2006.01)
  H01L 29/04      (2006.01)
  H01L 29/06      (2006.01)
  H01L 21/8258    (2006.01)
  H01L 21/8252    (2006.01)
  H01L 21/02      (2006.01)
  H01L 21/306     (2006.01)
  H01L 21/31      (2006.01)
  H01L 21/3205    (2006.01)
  H01L 21/768     (2006.01)
  H01L 21/8238    (2006.01)
  H01L 21/20      (2006.01)

(52) U.S. Cl.
  CPC ............ *H01L21/31* (2013.01); *H01L 21/3205* (2013.01); *H01L 21/768* (2013.01); *H01L 21/8252* (2013.01); *H01L 21/8258* (2013.01); *H01L 21/823807* (2013.01); *H01L 21/823871* (2013.01); *H01L 21/823878* (2013.01); *H01L 27/0617* (2013.01); *H01L 29/045* (2013.01); *H01L 29/0642* (2013.01); *H01L 29/0649* (2013.01); *H01L 29/16* (2013.01); *H01L 29/2003* (2013.01); *H01L 29/7787* (2013.01); *H01L 21/02389* (2013.01); *H01L 21/2015* (2013.01)

(56) References Cited

U.S. PATENT DOCUMENTS

| | | |
|---|---|---|
| 2005/0116290 A1 | 6/2005 | de Souza et al. |
| 2011/0108850 A1* | 5/2011 | Cheng ................ H01L 21/8252 257/76 |
| 2012/0305992 A1* | 12/2012 | Marino ............ H01L 21/02381 257/200 |
| 2013/0271208 A1* | 10/2013 | Then ...................... H01L 25/072 327/541 |
| 2014/0361371 A1* | 12/2014 | Comeau ............ H01L 27/1203 257/351 |
| 2015/0206796 A1* | 7/2015 | Dasgupta .......... H01L 21/02381 257/76 |

* cited by examiner ical examples of some common Group III
GROUP III NITRIDE INTEGRATION WITH CMOS TECHNOLOGY

BACKGROUND

The present application relates to a method for integrating a Group III nitride such as, for example, GaN, on a silicon substrate, and a semiconductor structure that is formed using the method of the present application.

Group III nitride-based devices are gaining interest for high speed and high power applications. Such devices contain at least one Group III nitride which is composed of nitrogen and at least one element from Group III, i.e., aluminum (Al), gallium (Ga) and indium (In), of the Periodic Table of Elements. Illustrative examples of some common Group III nitrides are GaN, AlN, InN, GaAlN, and GaAlInN. Despite the current interest in Group III nitride-based devices, silicon-based devices remain the choice for logic and low-power applications.

In some applications, it is imperative to benefit from both silicon (Si) and Group III nitride platforms for enabling the most efficient systems. Typically, Si-based devices can be used for switching Group III nitride-based devices in applications such as, for example, radar, communication and as a voltage inverter.

One common approach to provide a semiconductor structure containing both silicon-based devices and Group III nitride-based devices is to provide discrete components of silicon-based devices and Group III nitride-based devices and then to separately place them on the same platform. However, such an approach is not integrated and thus leads to a large footprint and scalability issues. In view of the above, there is a need to provide a method in which Group III nitride-based devices can be integrated with silicon-based devices.

SUMMARY

In one aspect of the present application, a method is provided in which a structure is formed that can be used to integrate Si-based devices, i.e., nFETs and pFETs, with Group III nitride-based devices, i.e., high electron mobility transistors (HEMTs). In one embodiment of the present application, the method includes providing a substrate containing an nFET device region, a pFET device region and a Group III nitride device region, wherein the substrate includes a topmost silicon layer and a <111> silicon layer located beneath the topmost silicon layer. Next, a trench is formed within the Group III nitride device region to expose a sub-surface of the <111> silicon layer. The trench is then partially filled with a Group III nitride base material, wherein the Group III nitride material base material has a topmost surface that is coplanar with, or below, a topmost surface of the topmost silicon layer.

In another aspect of the present application, a semiconductor structure is provided that can be used to integrate Si-based devices, i.e., nFETs and pFETs, with Group III nitride-based devices, i.e., a high electron mobility transistors (HEMTs). In one embodiment of the present application, the semiconductor structure of the present application includes a substrate containing an nFET device region, a pFET device region and a Group III nitride device region. The nFET device region and the pFET device region comprise a topmost silicon layer of the substrate. The Group III nitride device region comprises a <111> silicon layer of the substrate, a Group III nitride material base material having a first band gap located atop a surface of the <111> silicon layer, and a Group III nitride channel material having a second band gap located on a mesa portion of the Group III nitride base material, wherein the second band gap is different from the first band gap. The Group III nitride material base material has a topmost surface that is coplanar with, or below, a topmost surface of the topmost silicon layer.

DETAILED DESCRIPTION

Figure 1:
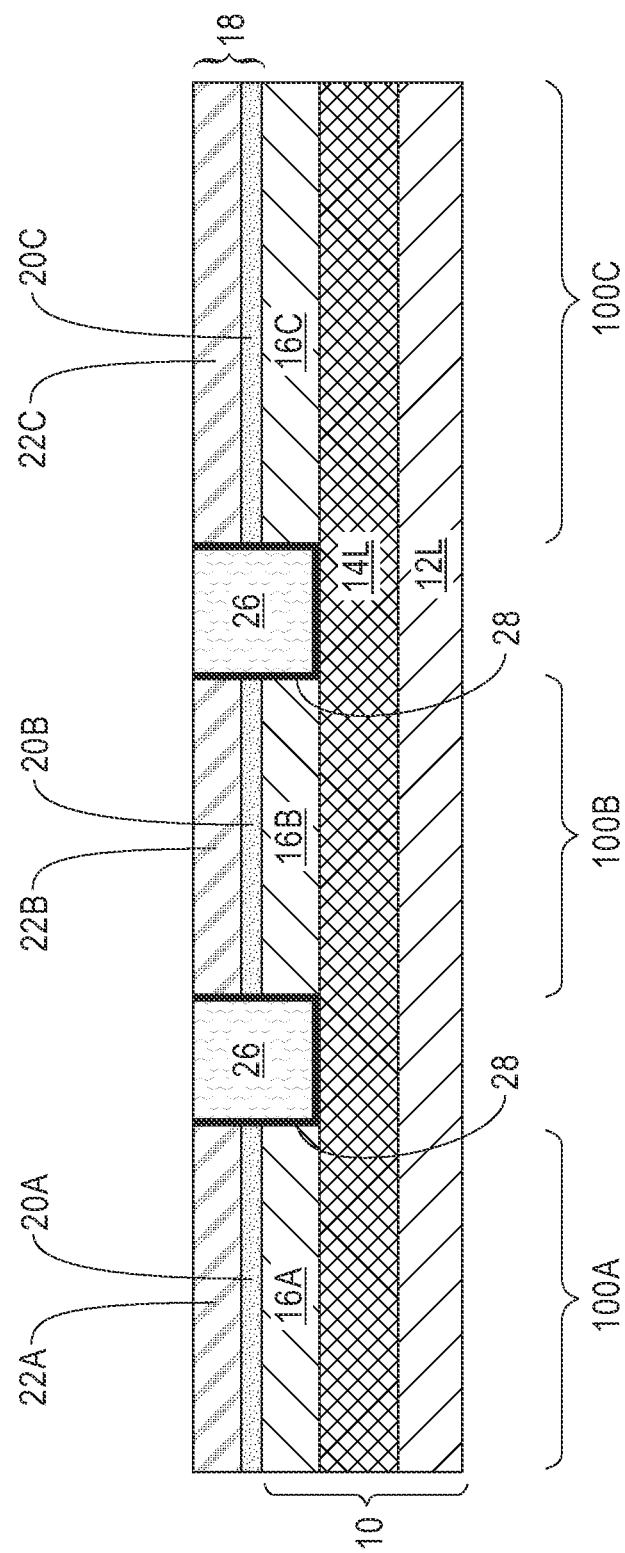
FIG. 1 is a cross sectional view of an exemplary semiconductor structure including trench isolation structures present within a hard mask and a topmost silicon layer of a substrate, wherein the trench isolation structures define an nFET device region, a pFET device region and a Group III nitride device region within the substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Typical growth of GaN/AlGaN on a silicon substrates requires a greater than 4 μm thick buffer layer of GaN to reduce defect density in the GaN. However, because of large thermal mismatch between GaN and Si, non-standard thick Si substrates are required to prevent cracking and breakage of Si during the growth. The Si thickness scales with the Si substrate diameter; thus, for example, the larger the diameter of the Si substrate, thicker Si is required. For a 200 mm diameter Si substrate, the substrate thickness should be typically greater than 1.5 mm to minimize warp, cracks and breakage during the GaN growth. For CMOS application, however, the Si substrate thickness cannot exceed 775 μm which is the industry standard. In order to prepare Group III nitride (i.e., GaN)—Si co-integrated substrate as outlined in the present application, a patterned growth and thinner Group III nitride base material (i.e., a GaN buffer layer) is required. In the present application, the Group III nitride base material thickness should be kept below 1.5 μm with a nominal patterned density of 50% or less so that the co-integrated substructure is compatible with further processing and lithography.

Referring first to FIG. 1, there is illustrated an exemplary semiconductor structure that can be employed in accordance with an embodiment of the present application. The exemplary semiconductor structure shown in FIG. 1 includes trench isolation structures (26, 28) present within a hard mask 18 and a topmost silicon layer of a substrate 10, wherein the trench isolation structures (26, 28) define an nFET device region 100A, a pFET device region 100B and a Group III nitride device region 100C within the substrate.

The nFET device region 100A is a region of the substrate 10 in which nFET devices will be subsequently formed. The pFET device region 100B is a region of the substrate 10 in which pFET devices will be subsequently formed. The Group III-nitride device region 100C is a region in which at least one Group III nitride-based device will be subsequently formed. In the present application, and by way of any example, the Group III nitride-based device is a high electron mobility transistor (HEMT). Other types of Group III nitride-based devices can be formed as desired.

In one embodiment of the present application, the substrate 10 includes a silicon-on-insulator (SOI) substrate comprising, from bottom to top, a <111> silicon layer 12L, an insulator layer 14L and a topmost silicon layer (not specifically shown; elements 16A, 16B and 16C of FIG. 1 represent portions of the topmost silicon layer of the SOI substrate that remain after forming the trench isolation structures (26, 28)). The term "<111> Si layer" denotes a silicon layer which has a <111> crystallographic surface orientation.

In one embodiment of the present application, the topmost silicon layer (i.e., 16A, 16B, 16C) of the SOI substrate may have a same crystallographic surface orientation as that of the <111> silicon layer 12L. In another embodiment of the present application, the topmost silicon layer (i.e., 16A, 16B, 16C) of the SOI substrate may have a different crystallographic orientation than the <111> silicon layer 12L. For example, the topmost silicon layer (i.e., 16A, 16B, 16C) of the SOI substrate may have a <100> or a <110> crystallographic orientation.

In some embodiments of the present application, the topmost silicon layer and the <111> silicon layer 12L of the SOI substrate are both single crystalline. The topmost silicon layer (i.e., 16A, 16B, 16C) and/or the <111> silicon layer 12L of the SOI substrate may be non-doped or doped at this point of the present application. When doped, the topmost silicon layer (i.e., 16A, 16B, 16C) and/or the <111> silicon layer 12L may contain an n-type dopant or p-type dopant. The term "n-type" denotes an impurity (e.g., dopant) that when added to an intrinsic semiconductor material contributes free electrons to the intrinsic semiconductor material. For silicon, antimony, arsenic and/or phosphorus may be used as an n-type impurity. The term "p-type" denotes an impurity (e.g., dopant) that when added to an intrinsic semiconductor material creates deficiencies of free electrons in the intrinsic semiconductor material. For silicon, boron, aluminum, gallium and/or indium may be used a p-type impurity. The dopant may be present in any concentration.

Insulator layer 14L of the SOI substrate may comprise a crystalline or non-crystalline oxide and/or nitride. In one embodiment, the insulator layer 14L of the SOI substrate is an oxide such as, for example, silicon oxide. In another embodiment, the insulator layer 14L of the SOI substrate is a nitride such as, for example, silicon nitride or boron nitride. In yet another embodiment, the insulator layer 14L of the SOI substrate may comprise a material stack, in any order, of silicon oxide and boron nitride.

The thickness of the topmost silicon layer (i.e., 16A, 16B, 16C) of substrate 10 may be from 10 nm to 100 nm. Other thicknesses that are lesser than, or greater than, the aforementioned thickness range may also be employed as the thickness of the topmost silicon layer (i.e., 16A, 16B, 16C). The thickness of the insulator layer 14L may be from 1 nm to 200 nm. Other thicknesses that are lesser than, or greater than, the aforementioned thickness range may also be employed as the thickness of the insulator layer 14L. The thickness of the <111> silicon layer 12L is typically from 100 nm to 1000 nm. Other thicknesses that are lesser than, or greater than, the aforementioned thickness range may also be employed as the thickness of the <111> silicon layer 12L.

The SOI substrate that can be employed as substrate 10 can be formed utilizing standard processes including for example, wafer bonding.

In some embodiments of the present application (not shown), insulator layer 14L can be omitted. In such an embodiment, substrate 10 includes the topmost silicon layer (i.e. 16A, 16B, 16C) and the <111> silicon layer 12L. Such a substrate can be referred to as a bulk silicon substrate since the entirety of the substrate is composed of silicon.

In some other embodiments (also not shown), a hybrid semiconductor substrate (bulk or SOI-like) can be used as substrate 10. In such an embodiment, at least the region of the substrate in which Group III nitride-based devices (i.e., Group III nitride device region 100C) are to be formed contains a <111> silicon layer. In one embodiment, the nFET device region of a hybrid substrate may be comprised of <100> silicon, the pFET device region of the hybrid substrate may be comprised of <110> silicon, and the Group III nitride device region of the hybrid substrate may be comprised of <111> silicon. Hybrid semiconductor substrates can be formed by techniques that are well known to those skilled in the art. See, for example, U.S. Pat. No. 7,329,923, U.S. Pat. No. 7,023,055 and U.S. Patent Application Publication No. 2005/0116290, the entire contents of each of these publications are incorporated herein by reference.

The exemplary semiconductor structure of FIG. 1 can be formed by first provided one of the substrates mentioned above. After providing the substrate 10, a hard mask 18 is formed on the topmost silicon layer of the substrate 10. In some embodiments (not shown), a blanket layer of a single hard mask material may be used as hard mask 18. In other embodiments (and as shown), the hard mask 18 may comprise a hard mask stack. In one example, the hard mask stack that comprises the hard mask 18 may comprise a first hard mask layer (remaining portions of which are labeled as elements 20A, 20B, 20C) of a first hard mask material and a second hard mask layer (remaining portions of which are labeled as elements 22A, 22B, 22C) of a second hard mask material that differs in composition and thus etch rate from the first hard mask material.

The blanket layer of hard mask material(s) is a contiguous layer that covers the entirety of the topmost silicon layer of the substrate 10. The blanket layer of hard mask material(s) that can be employed in the present application may include a semiconductor oxide, a semiconductor nitride and/or a semiconductor oxynitride. In one embodiment, the hard mask material that can be used in the present application can be comprised of silicon dioxide. In another embodiment, the hard mask material that can be used in the present application can be comprised of silicon nitride. In yet another embodiment, the hard mask material that can be used in the present application can include a hard mask stack of, in any order, silicon dioxide and silicon nitride. In the illustrated embodiment, the first hard mask layer (20A, 20B, 20C) may be comprised of silicon dioxide, while the second hard mask layer (22A, 22B, 22C) may be comprised of silicon nitride.

In some embodiments, the hard mask material that can be used in the present application can be formed by a deposition process such as, for example, chemical vapor deposition (CVD) or plasma enhanced chemical vapor deposition (PECVD). In other embodiments, the hard mask material that can be used in the present application can be formed by a thermal process such as, for example, thermal oxidation and/or thermal nitridation. In yet other embodiments, the hard mask material that can be used in the present application can be formed by a combination of a deposition process and a thermal process. The thickness of the hard mask material that can be used in the present application can range from 2 nm to 10 nm, with a thickness from 3 nm to 6 nm being more typical.

After forming the hard mask 18, the trench isolation structures (26, 28) can be formed. The trench isolation structures (26, 28) can be formed utilizing a conventional trench isolation process as is well known to those skilled in the art. For example, the trench isolation structures (26, 28) may be formed by lithography (i.e., applying a resist material by utilizing a deposition process such as, for example, spin-on coating or evaporation, exposing the resist to a desired pattern of irradiation, and developing the pattern utilizing a resist developer), etching (dry etch and/or wet etching) trenches within the hard mask 18 and the topmost silicon layer of substrate 10 and filling the trenches (i.e., by deposition such as, for example, chemical vapor deposition or plasma enhanced chemical vapor deposition) with a trench dielectric material 26 such as, for example, silicon dioxide. In one embodiment, the trenches used in forming the trench isolation structures (26, 28) can be etched utilizing an anisotropic etch such as, for example, reactive ion etching. Optionally, a trench liner 28 such as, for example, TiN and/or TaN may be formed in the trench prior to filling the trench with the trench dielectric material 26. The trench liner 28 is U-shaped and thus has a bottom horizontal liner portion and two vertical liner portions that are spaced apart and extend upward from a surface of the bottom horizontal liner portion. A densification step and/or a planarization process such as, for example, chemical mechanical polishing (CMP), may also be optionally used in providing the trench isolation structures (26, 28).

As is shown, each trench isolation structure (26, 28) that is formed extends entirely through the hard mask 18 and into the topmost silicon layer of substrate 10. As is also shown, each trench isolation structure (26, 28) has a topmost surface that is coplanar with a topmost surface of the hard mask 18. In the illustrated embodiment of the present application, each trench isolation structure (26, 28) has a topmost surface that is coplanar with a topmost surface of each remaining portion of the second hard mask layer. After forming each trench isolation structure (26, 28) portions of the hard mask 18 and portions of the topmost silicon layer remain. The remaining portions of the second hard mask layer of the illustrated embodiment are labeled as 22A, 22B and 22C, remaining portions of the first hard mask layer of the illustrated embodiment are labeled as 20A, 20B and 20C, and remaining portions of the topmost silicon layer of the substrate 10 are labeled as 16A, 16B and 16C. It is noted that the "A" designation denotes materials within the nFET device region 100A, the "B" designation denotes materials within the pFET device region 100B, while the designation "C" denotes materials within the Group III nitride device region 100C.

In some embodiments (and as illustrated in the present application) each trench isolation structure (26, 28) has a bottommost surface that extends to a topmost surface of the insulator layer 14L. In some embodiments and in which the insulator layer 14L is omitted, each trench isolation structure (26, 28) can extend to a topmost surface, or even beneath the topmost surface, of the <111> silicon layer 12L.

Figure 2A:
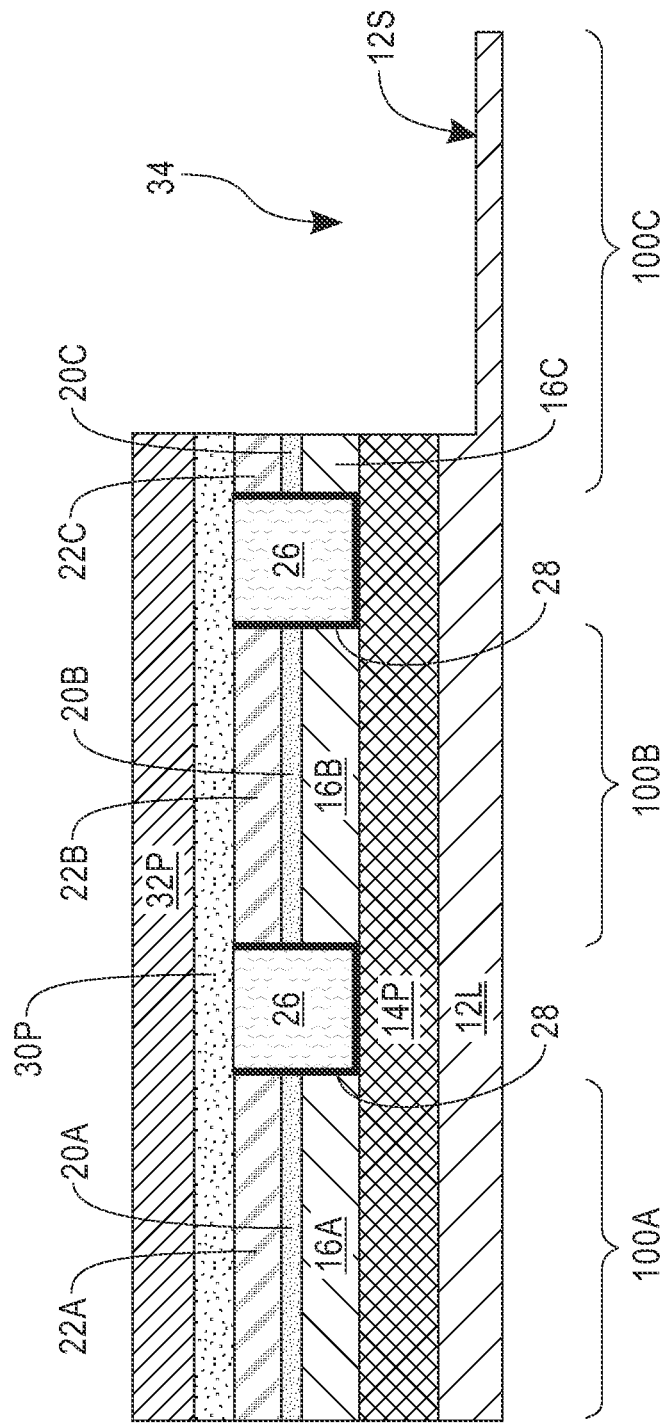
FIG. 2A is a cross sectional view of the exemplary semiconductor structure of FIG. 1 after forming a trench within the Group III nitride device region that exposes a <111> silicon sub-surface of the substrate.

Referring now to FIG. 2A, there is illustrated the exemplary semiconductor structure of FIG. 1 after forming a trench 34 within the Group III nitride device region 100C that exposes a <111> silicon sub-surface 12S of the substrate 10. The exemplary semiconductor structure shown in FIG. 2A can be formed by first forming a lithographic mask (not shown) of, from bottom to top, another hard mask layer (not shown) and a photoresist material. The another hard mask layer comprises a different hard mask material than that of the topmost hard mask material of hard mask 18. In one example, the another hard mask layer is composed of silicon dioxide, while the topmost hard mask layer (i.e., the second hard mask layer 22A, 22B, 22C) is composed of silicon nitride. The photoresist material can then be patterned by exposing the same to a trench pattern of irradiation and then developing the photoresist material. The pattern within the remaining portion of the photoresist material is then transferred into the underlying material layers to provide trench 34 within the Group III nitride device region 100C. The transferring of the pattern from the patterned resist material into the underlying materials may comprise one or more etching (dry and/or wet) processes. In one example, a reactive ion etch may be used to provide trench 34. In FIG. 2A, element 30P represents a remaining portion of the another hard mask layer, while element 32P represents a remaining portion of the photoresist material (i.e., the patterned resist).

Figure 2B:
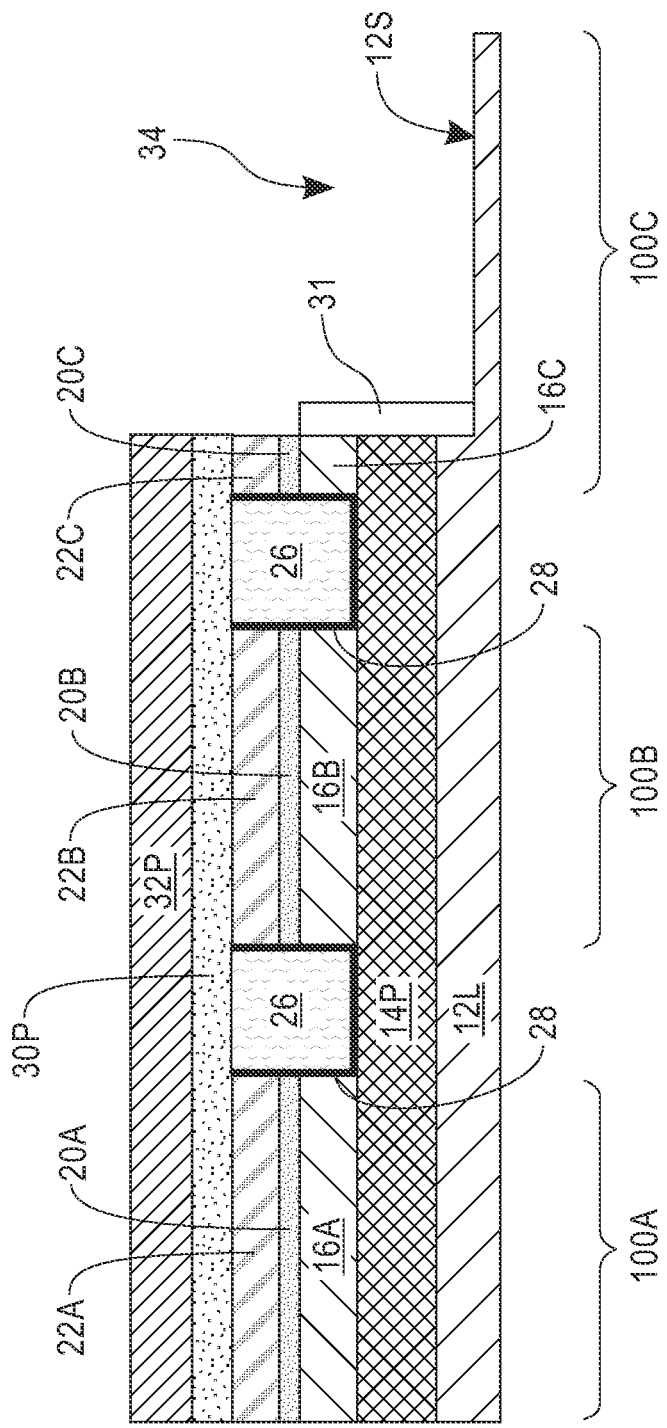
FIG. 2B is a cross sectional view of the exemplary semiconductor structure of FIG. 2A after forming a spacer on exposed sidewall surfaces with the trench.

Referring now to FIG. 2B, there is illustrated the exemplary structure shown in FIG. 2A after forming an optional spacer 33 along the sidewalls of the trench. The optional spacer 31 may comprise any dielectric material including for example, silicon oxide, silicon nitride and/or silicon oxynitride. The optional spacer 31 can be formed by deposition of a dielectric material, and then patterning the deposited spacer material by utilizing an etching. The optional spacer has a topmost surface that is coplanar with, or located above, the topmost surface of each remaining portion of the topmost silicon layer (16A, 16B, 16C). The spacer 31 is employed to prevent direct contact of the Group III nitride base material (to be subsequently formed) with any sidewall surface of the topmost silicon layer of substrate 10.

Figure 3:
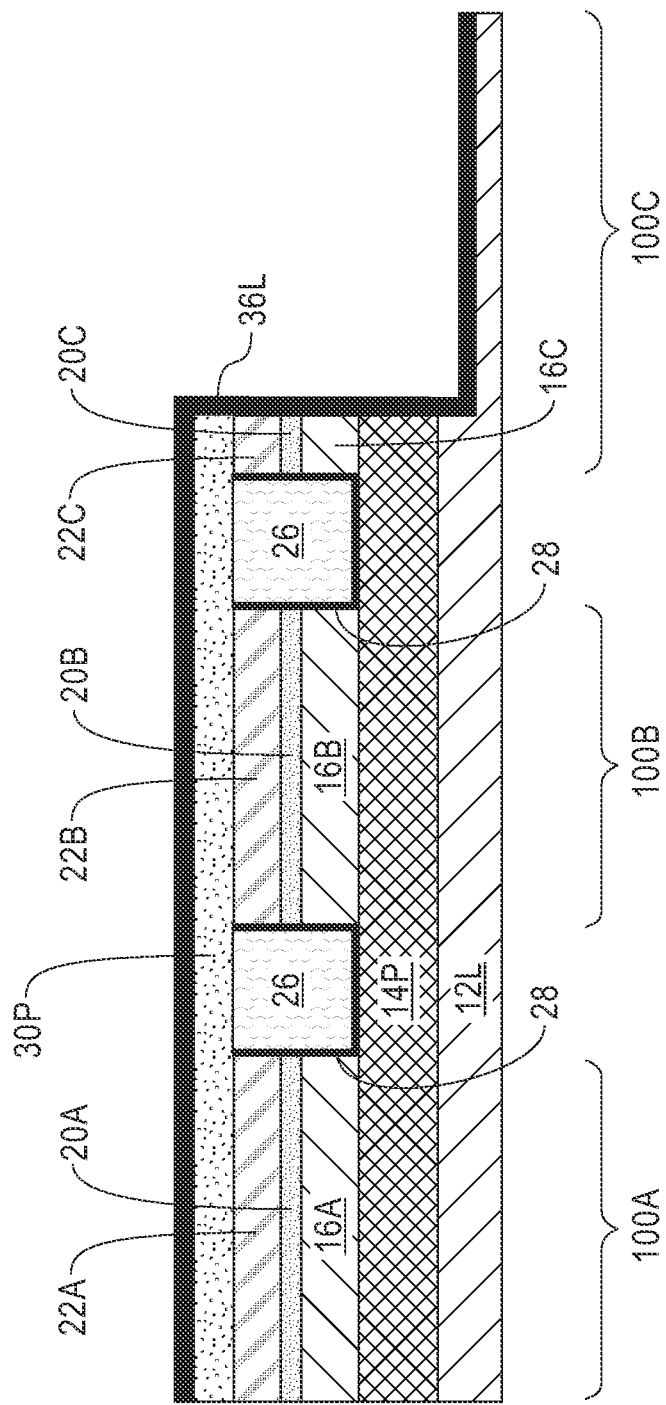
FIG. 3 is a cross sectional view of the exemplary semiconductor structure of FIG. 2A after forming a contiguous Group III nitride growth seed layer.

Referring now to FIG. 3, there is illustrated the exemplary semiconductor structure of FIG. 2A after stripping the patterned resist 32P and forming a contiguous Group III nitride growth seed layer 36L. Although this and the following processing steps utilize the structure shown in FIG. 2A, the structure shown in FIG. 2B can also be used and processed as described in FIGS. 3-17. The contiguous Group III nitride growth seed layer 36L is formed on the now exposed topmost surface of the remaining portion of the another hard mask layer 30P, along sidewalls of the various materials defined by trench 34 and on the exposed <111> silicon sub-surface 12S of the substrate 10. In some embodiments, it may be possible to omit the formation of the contiguous Group III nitride growth seed layer 36L. When the exemplary structure shown in FIG. 2B is used, the contiguous Group III nitride growth seed layer 36L is formed on an exposed sidewall of the spacer 31.

The contiguous Group III nitride growth seed layer 36L can be composed of any material including a Group III nitride such as, for example, AlN, which can facilitate the growth of Group III nitride base material. AN can be used as a contiguous Group III nitride growth seed layer 36L for facilitating the growth of a GaN base material.

The contiguous Group III nitride growth seed layer 36L can be formed by metalorganic chemical vapor deposition (MOCVD). The MOCVD process may include introducing a Group III-containing precursor and a nitride precursor into the reactor chamber of an MOCVD apparatus. In some embodiments, the Group III-containing precursor may be an organo-Group III containing compound, i.e., an organoaluminum compound, an organoindium compound, and/or an organogallium compound. In other embodiments, a Group III halide (typically a chloride) can be employed as the Group III-containing precursor. When an organo-Group III containing compound is employed, the Group III-containing precursor can be, for example, a trialkyl-Group III compound, wherein the alkyl contains from 1 to 6 carbon atoms. Examples of Group III compounds that can be employed in the present application, include, but are not limited to, trimethylaluminum, triethylaluminum, tributylaluminum, trimethylgallium, triethylgallium, tributylgallium, trimethylindium, triethylindium, and/or tributylindium. Examples of nitride containing precursors that can be used include, for example, ammonium nitride.

An inert carrier gas may be present with one of the precursors used in forming the contiguous Group III nitride growth seed layer 36L, or an inert carrier gas can be present with both the precursors (i.e., Group III-containing precursor and a nitride precursor) used in forming the contiguous Group III nitride growth seed layer 36L. The deposition of the contiguous Group III nitride growth seed layer 36L is typically performed at a temperature of 850° C. or greater. In one embodiment, the deposition of the contiguous Group III nitride growth seed layer 36L typically occurs at a temperature from 900° C. to 1200° C. In another embodiment, the deposition of the contiguous Group III nitride growth seed layer 36L typically occurs at a temperature from 1200° C. to 1400° C. Notwithstanding the temperature in which the contiguous Group III nitride growth seed layer 36L is formed, the deposition of the contiguous Group III nitride growth seed layer 36L can be performed for a time period of 1 minute to 2 hours. The thickness of the contiguous Group III nitride growth seed layer 36L that is formed can be from 100 nm to 300 nm. Other thicknesses that are lesser than, or greater than, the aforementioned thickness range can also be employed as the thickness of the contiguous Group III nitride growth seed layer 36L Referring now to FIG. 4, there is illustrated the exemplary semiconductor structure of FIG. 3 after selectively removing the Group III nitride growth seed layer 36L from atop the nFET device region 100A and the pFET device region 100B, while leaving a portion of the Group III nitride growth seed layer within the trench 34 and within the Group III nitride device region 100C. This step of the present application re-exposes the topmost surface of the remaining portion of the another hard mask layer 30P located atop the nFET device region 100A and the pFET device region 100B.

Figure 4:
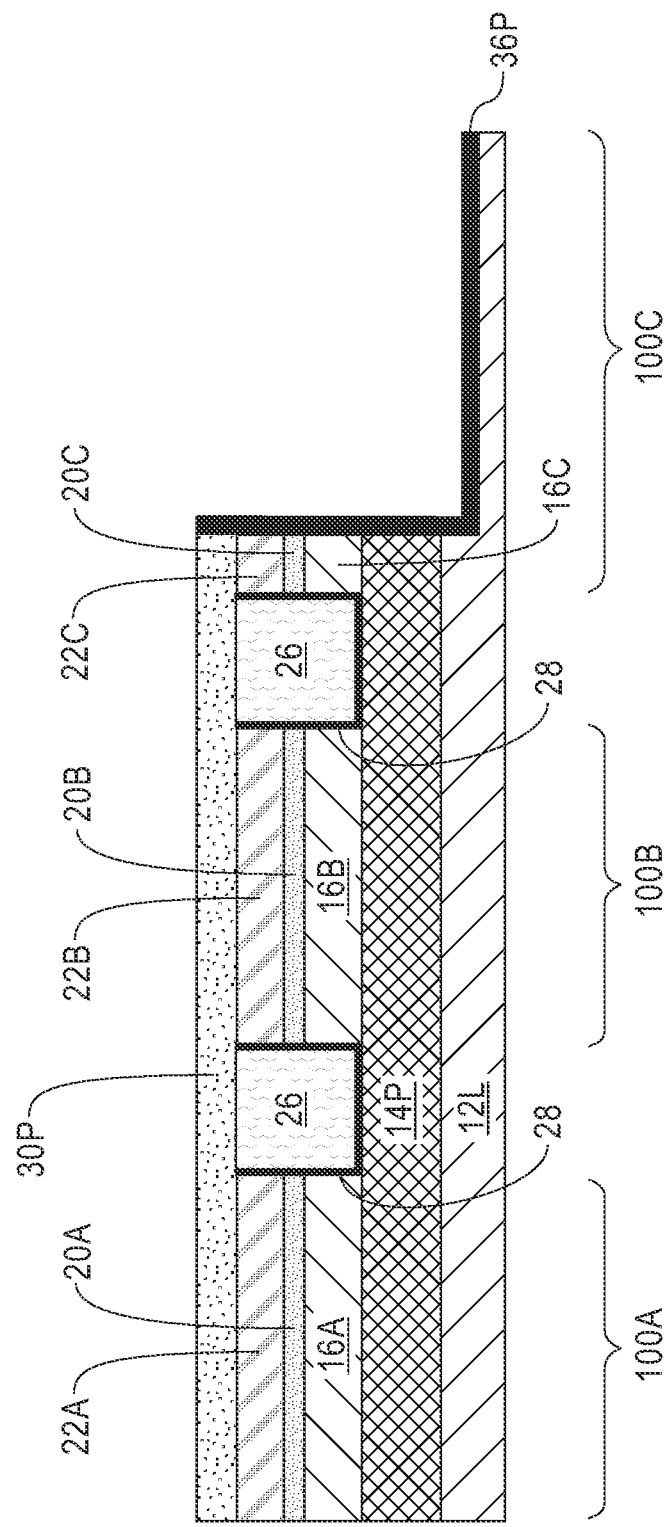
FIG. 4 is a cross sectional view of the exemplary semiconductor structure of FIG. 3 after selectively removing the Group III nitride growth seed layer from atop the nFET device region and the pFET device region, while leaving a portion of the Group III nitride growth seed layer within the trench and within the Group III nitride device region.

The Group III nitride growth seed layer 36L can be selectively removed from atop the nFET device region 100A and the pFET device region 100B by first forming a block mask material such as, for example, a photoresist material, over the entire exemplary structure of FIG. 4. A planarization process such as, for example, chemical mechanical polishing and/or grinding, can follow the deposition of the block mask material to remove the block mask material and the Group III nitride growth seed layer 36L from atop the nFET device region 100A and the pFET device region 100B. After planarization, the block mask material that remains in the trench 34 can be removed utilizing an etching process that selectively removes the block mask material. When a photoresist is employed as the block mask material, an ashing process can be used to remove the block mask material that remains in the trench 34.

The portion of the portion of the Group III nitride growth seed layer within the trench 34 and within the Group III nitride device region 100C can be referred to herein as a Group III nitride growth seed portion 36P. The Group III nitride growth seed portion 36P that remains in the trench 34 can be L-shaped as shown.

Figure 5:
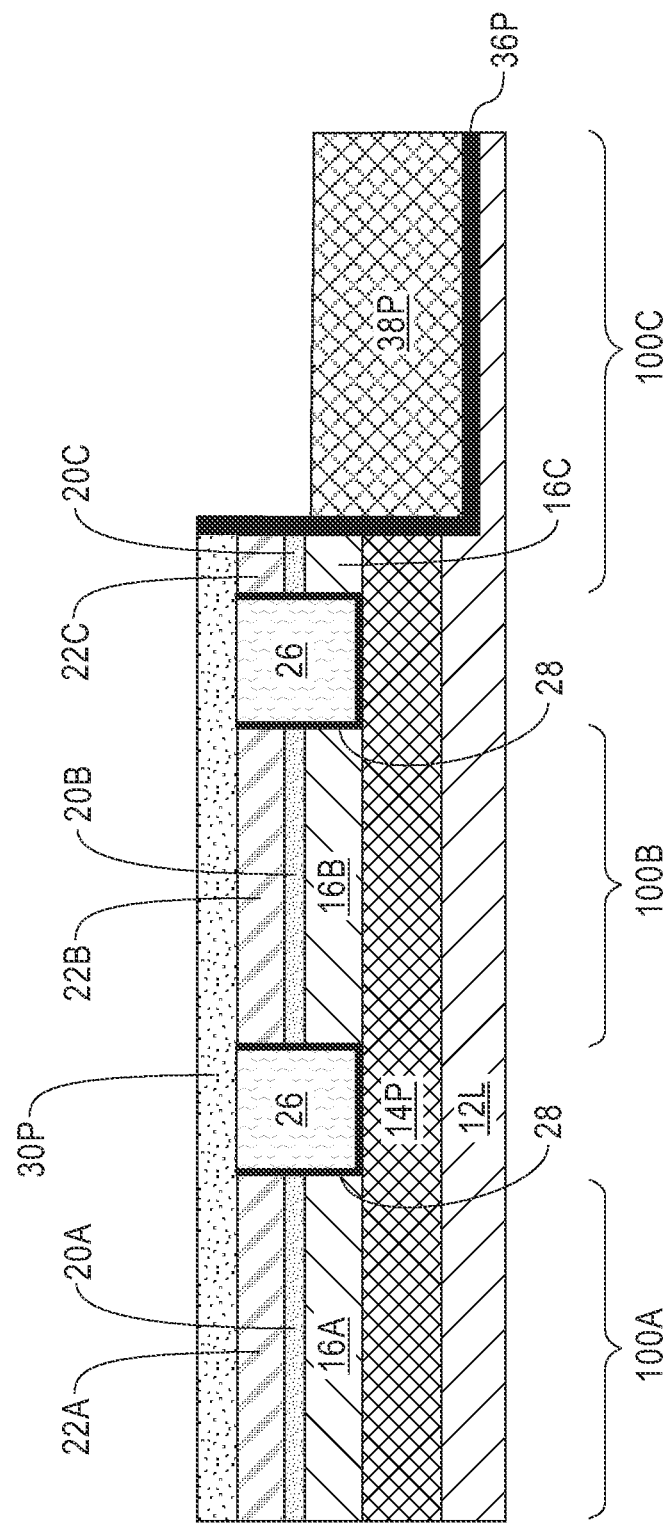
FIG. 5 is a cross sectional view of the exemplary semiconductor structure of FIG. 4 after partially filling the trench with a Group III nitride base material having a first band gap.

Referring now to FIG. 5, there is illustrated the exemplary semiconductor structure of FIG. 4 after partially filling the trench 34 with a Group III nitride base material 38P having a first band gap. By "partially filling the trench" it is meant that the topmost surface of the Group III nitride base material 38P does not extend beyond the topmost surface of the remaining portion of the another hard mask layer 30P. Typically, and as shown, the topmost surface of the Group III nitride base material 38P is coplanar with the topmost surface of each remaining portion of the topmost silicon layer (16A, 16B, 16C) of substrate 10. In some embodiments, the topmost surface of the Group III nitride base material 38P may be located beneath the topmost surface of each remaining portion of the topmost silicon layer (16A, 16B, 16C) of the substrate 10.

The term "Group III nitride" as used throughout the present applicant denotes a compound that is composed of nitrogen and at least one element from Group III, i.e., aluminum (Al), gallium (Ga) and indium (In), of the Periodic Table of Elements. Illustrative examples of some common Group III nitride compounds are GaN, AlN, InN, GaInN, GaAlN, and GaAlInN. In one embodiment of the present application, the Group III nitride material that provides the Group III nitride base material 38P is a gallium-containing nitride material such as, for example, GaN, GaAlN, GaAlInN, and GaInN. Of the gallium-containing nitride materials, GaN is preferred in some embodiments of the present application. Notwithstanding the composition of the Group III nitride material that provides the Group III nitride base material 38P, the Group III nitride base material 38P is single crystal.

The deposition of the Group III nitride base material 38P can be performed by metalorganic chemical vapor deposition (MOCVD). The MOCVD process used in providing the Group III nitride base material 38P may include one of the Group III-containing precursors and one of the nitride precursors mentioned above in forming the contiguous Group III nitride growth seed layer 36L. An inert gas may be present during the MOCVD process. The deposition of the Group III nitride base material 38P can be performed utilizing conditions (temperatures and time) within the ranges mentioned above in providing the contiguous Group III nitride growth seed layer 36L. The thickness of the Group III nitride base material 38P that is typically from 100 nm to 10,000 nm. Other thicknesses that are lesser than, or greater than, the aforementioned thickness range may also be used as the thickness of the Group III nitride base material 38P.

In some embodiments of the present application the Group III nitride material that provides the Group III nitride base material 38P can be deposited until it overfills the trench 34. In such an embodiment, the overburdened Group III nitride material can be removed by first subjecting the overburdened Group III nitride material to a planarization process such as, for example, chemical mechanical polishing and/or grinding, and thereafter a recess etch can be used to remove a topmost portion of the Group III nitride material within the trench 34 so as to provide the Group III nitride base material 38P. In another embodiment, a timed MOCVD process can be used in which the deposition only partially fills trench 34 with the Group III nitride material that provides the Group III nitride base material 38P. In such an embodiment, a recess etch may, or may not, be employed.

Figure 6:
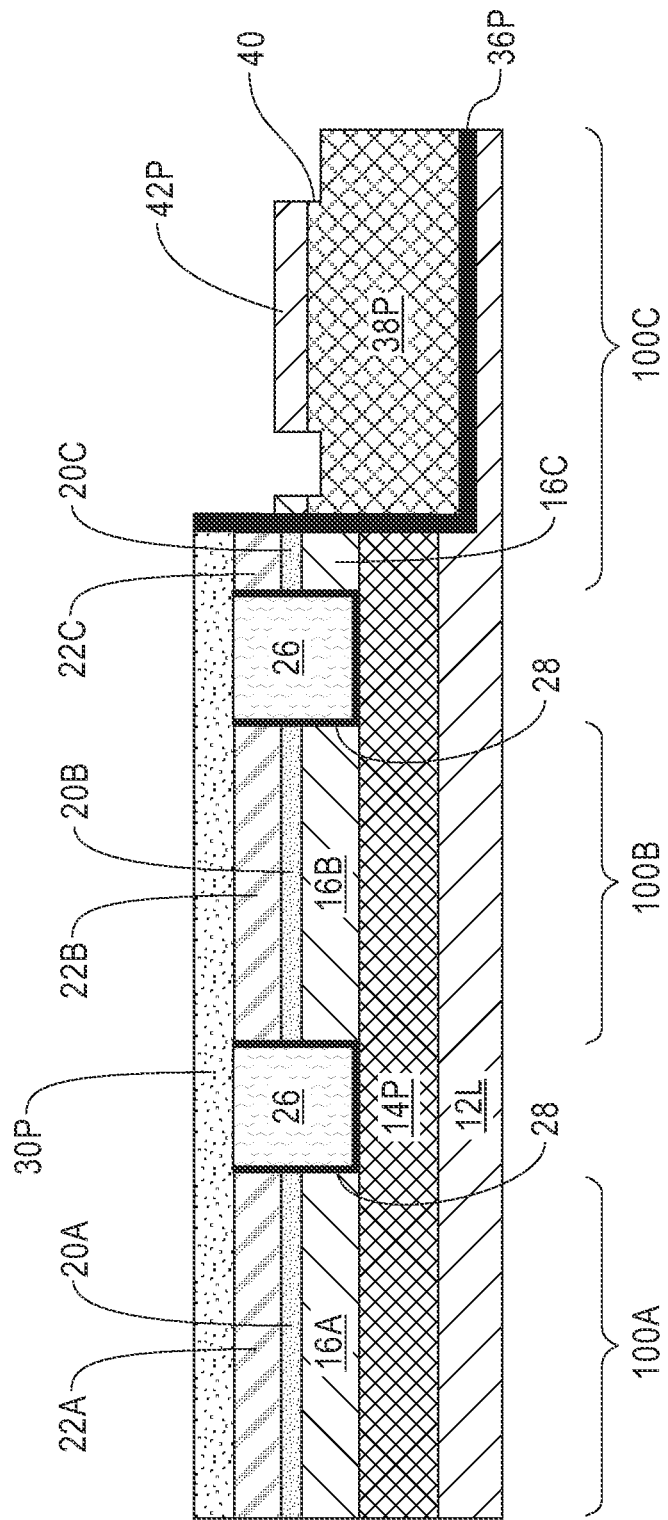
FIG. 6 is a cross sectional view of the exemplary semiconductor structure of FIG. 5 after forming a Group III nitride channel material having a second band gap that differs from the first band gap on a mesa portion of the Group III nitride base material.

Referring now to FIG. 6, there is illustrated the exemplary semiconductor structure of FIG. 5 after forming a Group III nitride channel material 42P having a second band gap that differs from the first band gap on a mesa portion 40 of the Group III nitride base material 38P. Since the second band gap differs from the first band gap, a heterostructure is formed. In some embodiments of the present application, the second band gap is greater than the first band gap. In another embodiment of the present application, the second band gap is lower than the first band gap. In one example, the Group III nitride channel material 42P comprises AlGaN, while the Group III nitride base material 38P comprised GaN.

The exemplary semiconductor structure of FIG. 5 can be formed by first forming a contiguous layer of a Group III nitride material (not shown) having the second band gap. The contiguous layer of a Group III nitride material can be formed by MOCVD as described above in forming the Group III nitride growth seed layer 36L. The contiguous layer of a Group III nitride material is formed over the remaining portion of the another hard mask layer 30P present atop the nFET device region 100A and the pFET device region 100B, and along exposed sidewalls of the Group III nitride growth seed portion 36P within trench 34 and on the exposed surface of the Group III nitride base material 38P. The Group III nitride material that provides the Group III nitride channel material 42P is then removed from atop the another hard mask layer 30P present atop the nFET device region 100A and the pFET device region 100B by lithography and etching. After this step, the photoresist material that remains in the trench 34 is removed. The Group III nitride material that provides the Group III nitride channel material 42P now remains only in the trench 34. The Group III nitride material that provides the Group III nitride channel material 42P that remains in the trench and a portion of the underlying Group III nitride base material 38P that is within the trench 34 is then patterned utilizing another lithographic patterning process. It is noted that although a single mesa portion 40 of the Group III nitride base material 38P and a single Group III nitride channel material 42P is described and illustrated, a plurality of such mesa portions 40 and overlying Group III nitride channel materials 42P can be formed in the trench 34.

Notably, FIG. 6 illustrates a semiconductor structure that includes a substrate (10) containing an nFET device region 100A, a pFET device region 100B and a Group III nitride device region 100C. The nFET device region 100A and the pFET device region 100B comprise a topmost silicon layer 16A, 16B of the substrate. The Group III nitride device region 100C comprises a <111> silicon layer 12L of the substrate, a Group III nitride material base material 38P having a first band gap located atop a surface of the <111> silicon layer 12L, and a Group III nitride channel material 42P having a second band gap located on a mesa portion 40 of the Group III nitride base material 38P, wherein the second band gap is different from the first band gap. The Group III nitride material base material 38P has a topmost surface that is coplanar with, or below, a topmost surface of the topmost silicon layer 16A, 16B.

Figure 7A:
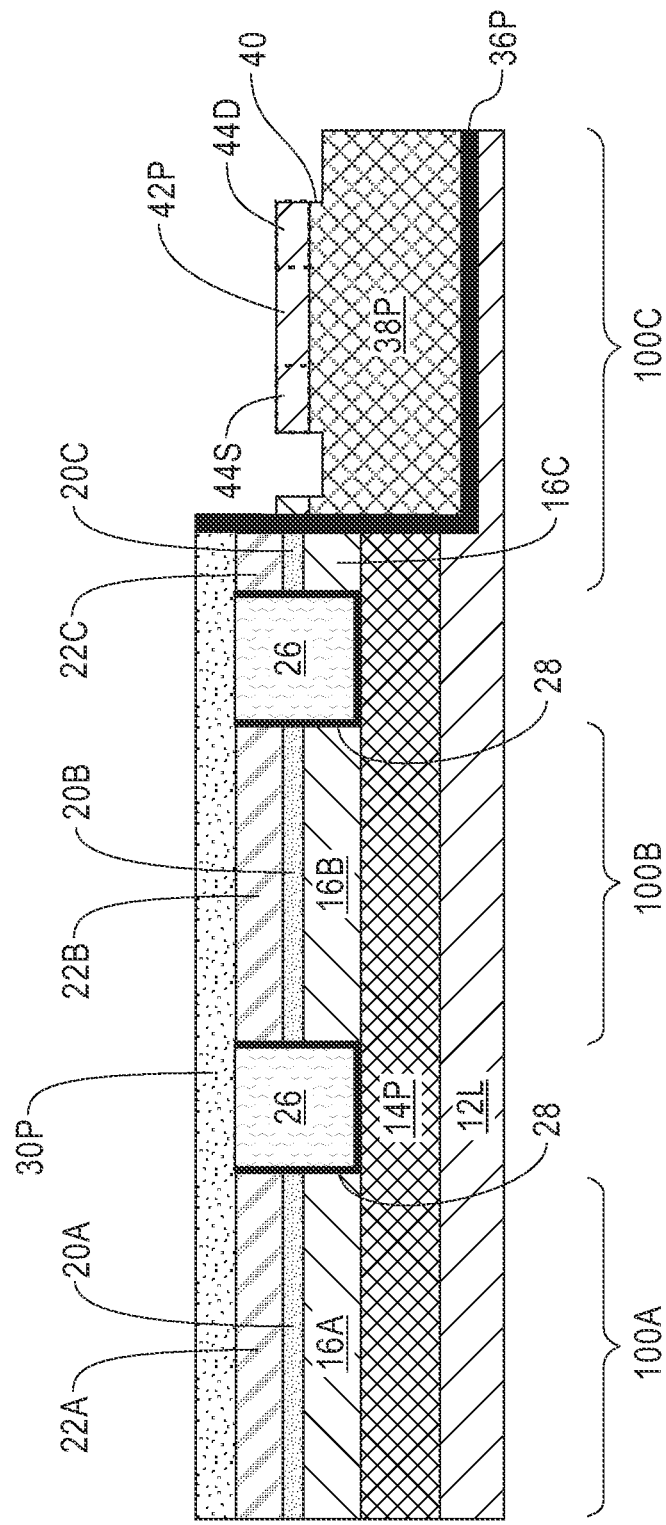
FIG. 7A is a cross sectional view of the exemplary semiconductor structure of FIG. 6 after forming source/drain regions within end portions of the Group III nitride channel material in accordance with one embodiment of the present application.

Referring now to FIG. 7A, there is illustrated the exemplary semiconductor structure of FIG. 6 after forming source/drain regions 44S/44D within end portions of the Group III nitride channel material 42P in accordance with one embodiment of the present application. The source/drain regions 44S/44D can be formed by forming a mask (such as a photoresist) over all portions of the exemplary semiconductor structure of FIG. 6 except for the end portions of the Group III nitride channel material 42P. An n-type dopant is then introduced into the exposed end portions of the Group III nitride channel material 42P not protected by the mask by utilizing ion implantation or gas phase doping. The concentration of n-type dopant that can be introduced into the end portions of the Group III nitride channel material 42P can be in a range from 1E18 atoms/cm$^3$ to 1E21 atoms/cm$^3$. Other concentrations are possible and are not excluded from the present application. After introducing the n-type dopant in the end portions of the Group III nitride channel material 42P, the mask can be removed from the structure utilizing any conventional mask stripping process. In some embodiments, an activation anneal (550° C. or above) can be performed to activate the n-type dopants at this point of the present application. The activation of the n-type dopant can be delayed and performed anytime later in the process flow of the present application. In some embodiments, a p-type dopant may be introduced into the end portions of the Group III nitride channel material in lieu of the n-type dopant.

Figure 7B:
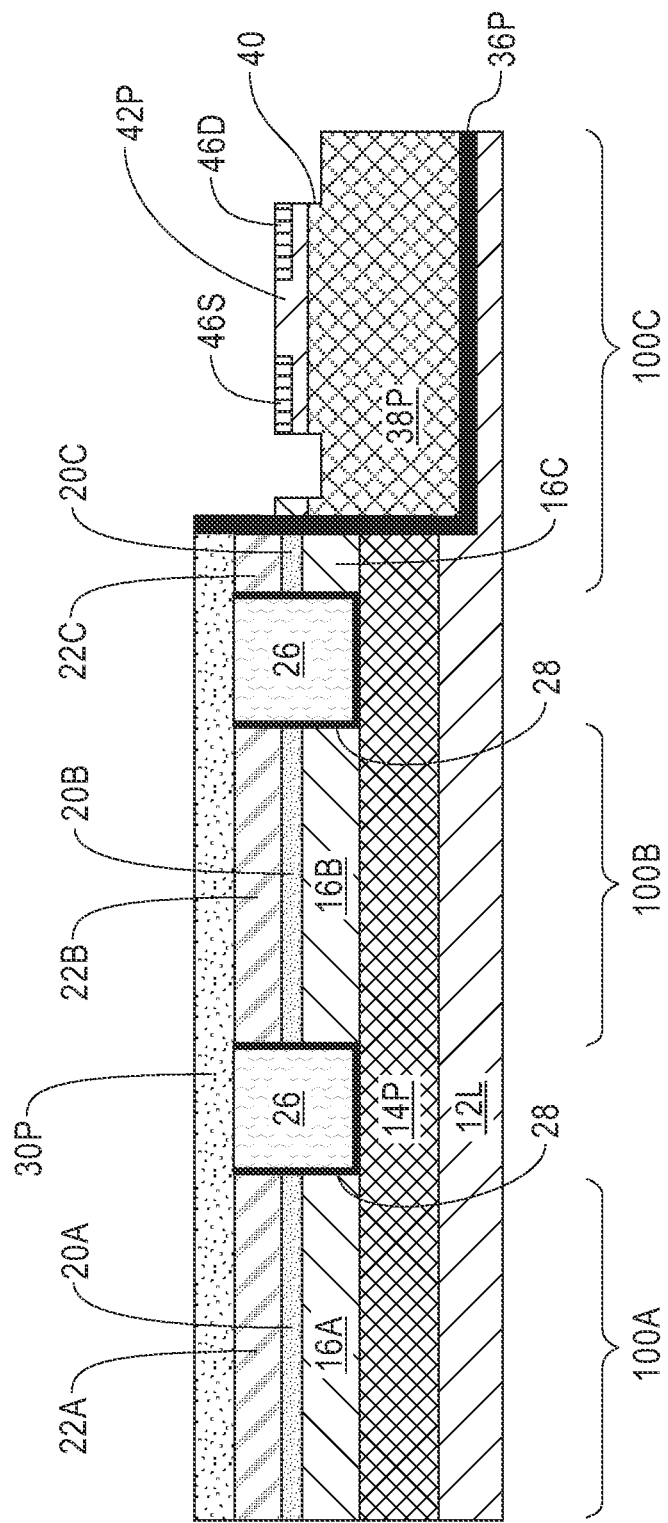
FIG. 7B is a cross sectional view of the exemplary semiconductor structure of FIG. 6 after forming metal source/drain regions within end portions of the Group III nitride channel material in accordance with another embodiment of the present application.

Referring now to FIG. 7B, there is illustrated the exemplary semiconductor structure of FIG. 6 after forming metal source/drain regions 46S/46D within end portions of the Group III nitride channel material 42P in accordance with another embodiment of the present application. The metal source/drain regions 46S/46D can be formed by forming a mask (such as a photoresist) over all portions of the exemplary semiconductor structure of FIG. 6 except for the end portions of the Group III nitride channel material 42P. The exposed ends portions of the Group III nitride channel material 42P are then subjected to a partial recess etch. Metal source/drain regions 46S/46D are then formed on the recessed end portions of the Group III nitride channel material 42P by depositing a conductive metal such as, for example, tungsten or aluminum. After depositing the conductive metal that provides the metal source/drain regions 46S/46D, the mask can be removed from the structure utilizing any conventional mask stripping process.

Figure 8:
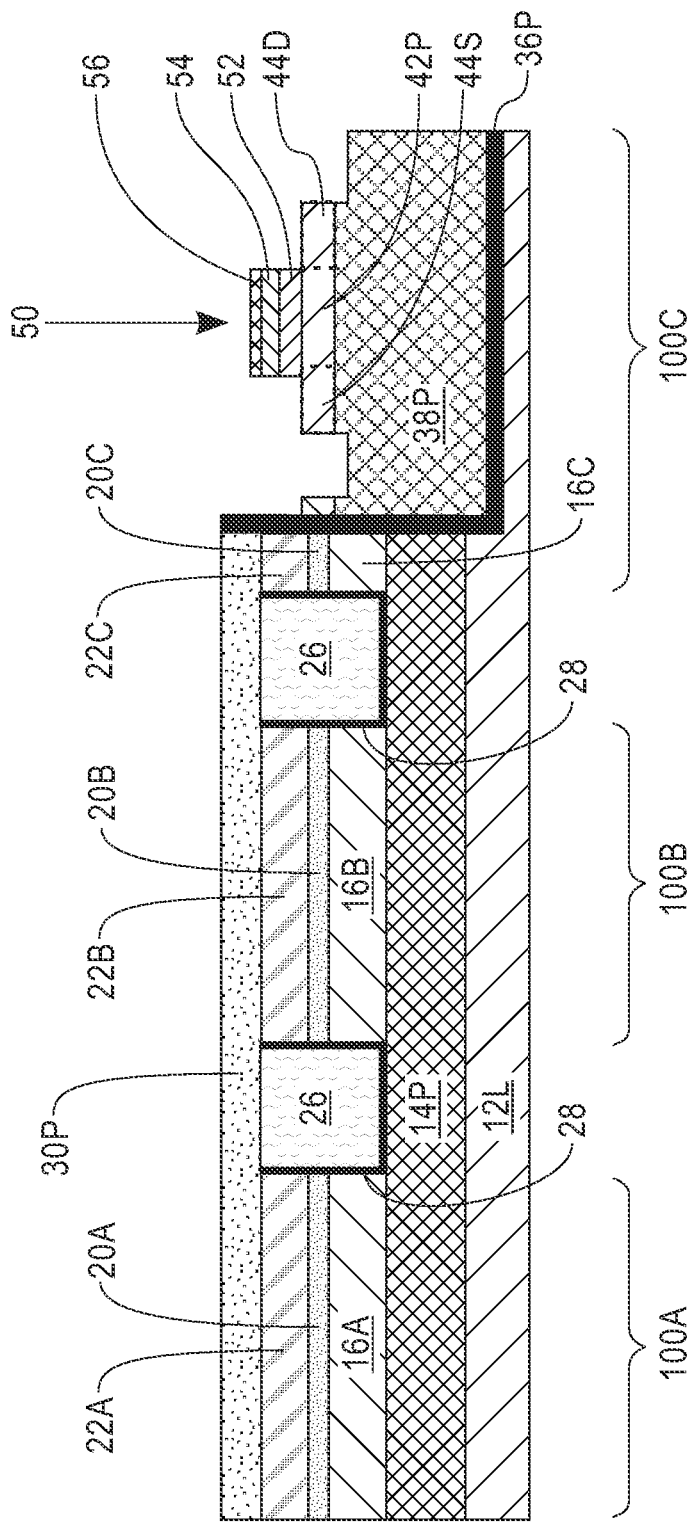
FIG. 8 is a cross sectional view of the exemplary semiconductor structure of FIG. 7A after forming a high electron mobility transistor (HEMT) gate structure on a topmost surface of the Group III nitride channel material.

Referring now to FIG. 8, there is illustrated the exemplary semiconductor structure of FIG. 7A after forming a high electron mobility transistor (HEMT) gate structure 50 on a topmost surface of the Group III nitride channel material 42P. Although the present application describes and illustrates using the exemplary semiconductor structure shown in FIG. 7A, the present application also works using the exemplary semiconductor structure shown in FIG. 7B. Also, and although a single mess region 40, a single Group III nitride channel material 42P and a single high electron mobility transistor (HEMT) gate stack are described and illustrated, a plurality of each can be formed within the Group III nitride device region 100C.

In some embodiments of the present application, and as shown, the HEMT gate structure 50 is a functional gate structure. By "functional gate structure" it is meant a permanent gate structure used to control output current (i.e., flow of carriers in the channel) of a semiconducting device through electrical or magnetic fields. The high electron mobility transistor (HEMT) gate structure 50 includes, from bottom to top, a HEMT gate dielectric portion 52 and a HEMT gate conductor portion 54. In some embodiments, the HEMT gate structure 50 also includes a HEMT hard mask cap portion 56.

The HEMT gate dielectric portion 52 comprises a gate dielectric material. The gate dielectric material that provides the HEMT gate dielectric portion 52 can be an oxide, nitride, and/or oxynitride. In one example, the gate dielectric material that provides the HEMT gate dielectric portion 52 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the HEMT gate dielectric portion 52.

The gate dielectric material used in providing the HEMT gate dielectric portion 52 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each HEMT gate dielectric portion 52 comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the HEMT gate dielectric portion 52 can have a thickness in a range from 1 nm to 10 nm. Other thicknesses that are lesser than, or greater than, the aforementioned thickness range can also be employed for the gate dielectric material.

The HEMT gate conductor portion 54 comprises a gate conductor material. The gate conductor material used in providing the HEMT gate conductor portion 54 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the HEMT gate conductor portion 54 may comprise an nFET gate metal. In other embodiments, the HEMT gate conductor portion 54 may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the HEMT gate conductor portion 54 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the HEMT gate conductor portion 54 has a thickness from 1 nm to 100 nm. Other thicknesses that are lesser than, or greater than, the aforementioned thickness range can also be employed for the gate conductor material used in providing the HEMT gate conductor portion 54.

If present, the HEMT gate cap portion 56 comprises a gate cap material. The gate cap material that provides each HEMT gate cap portion 56 may include one of the dielectric materials mentioned above for hard mask 18. In one embodiment, each HEMT gate cap portion 56 comprises silicon dioxide, silicon nitride, and/or silicon oxynitride. The dielectric material that provides each HEMT gate cap portion 56 can be formed utilizing a conventional deposition process such as, for example, chemical vapor deposition or plasma enhanced chemical vapor deposition. The dielectric material that provides each HEMT gate cap portion 56 can have a thickness from 5 nm to 20 nm. Other thicknesses that are lesser than, or greater than, the aforementioned thickness range can also be employed as the thickness of the dielectric material that provides each HEMT gate cap portion 56.

Each functional HEMT gate structure 50 can be formed by providing a functional gate material stack of, from bottom to top, the HEMT gate dielectric material, the HEMT gate conductor material and, if present, the HEMT gate cap material. The functional HEMT gate material stack can then be patterned. In one embodiment of the present application, patterning of the functional HEMT gate material stack may be performed utilizing lithography and etching.

In other embodiments of the present application, the HEMT gate structure 50 is a sacrificial gate structure. By sacrificial gate structure" it is meant a material or material stack that serves as a placeholder for a subsequently formed functional gate structure. In such a process, the functional HEMT gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the HEMT gate dielectric portion 52. The sacrificial gate material portion includes one of the gate conductor materials mentioned above for HEMT gate conductor portion 54. The sacrificial gate cap portion includes one of the gate cap material mentioned above for HEMT gate cap portions 56. The sacrificial gate structures can be formed by deposition of the various material layers and then patterning the resultant sacrificial material sack by utilizing, for example, lithography and etching.

Figure 9:
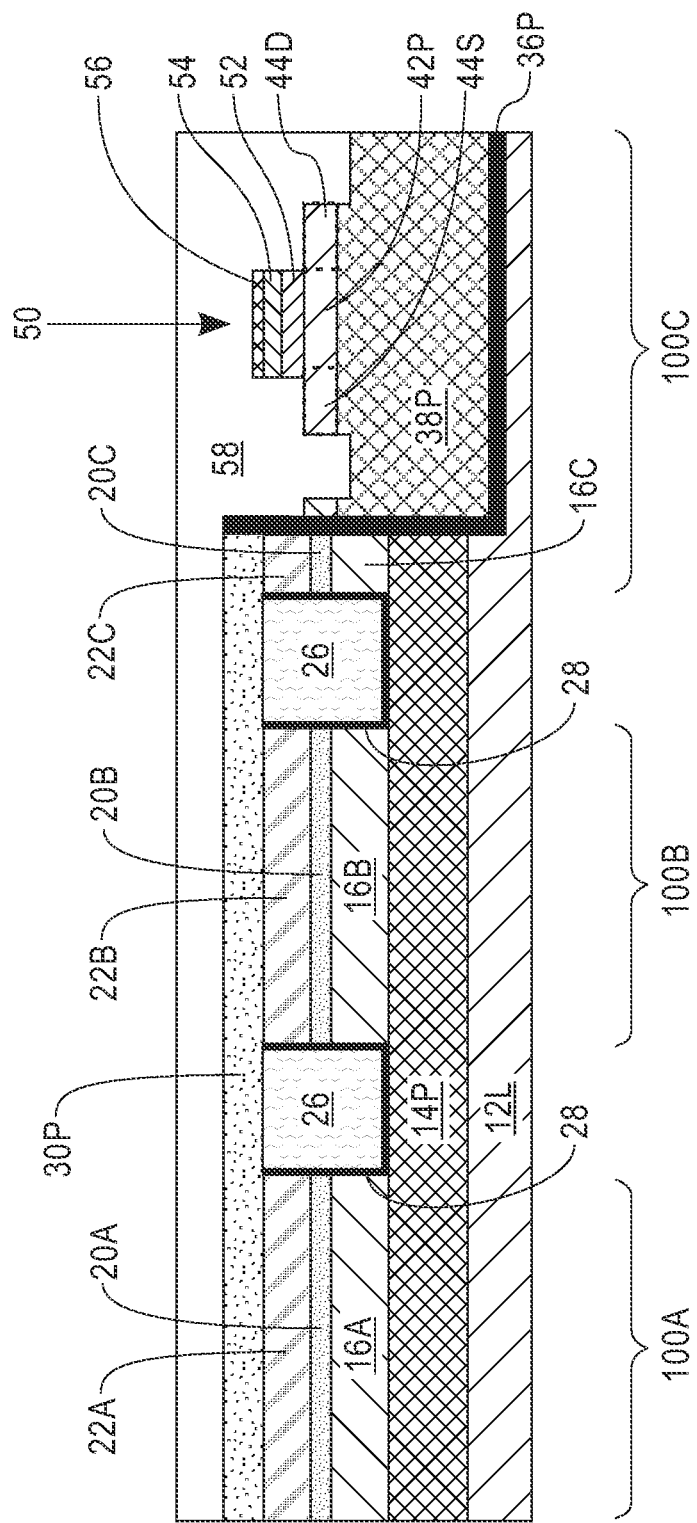
FIG. 9 is a cross sectional view of the exemplary semiconductor structure of FIG. 8 after forming an oxide layer within the nFET device region, the pFET device region and the Group III nitride device region.

Referring now to FIG. 9, there is illustrated the exemplary semiconductor structure of FIG. 8 after forming an oxide layer 58 within the nFET device region 100A, the pFET device region 100B and the Group III nitride device region 100C. The oxide layer 58 can be formed by first depositing an oxide material that can fill the trench 34 (i.e., a gap filling oxide material); oxide also forms atop the remaining portion of the another hard mask layer 30P. In one embodiment, the oxide layer 58 comprises an oxide that can be derived from TEOS (tetraethylorthosilicate). In another embodiment, the oxide layer 58 may comprise a flowable oxide such as, for example, silicon oxide containing hydrogen and carbon. The deposition of the oxide material (i.e., gap filling oxide material) may include for example, CVD or PECVD. In some embodiments, a planarization process may be employed to provide the exemplary semiconductor structure shown in FIG. 9. In other embodiments, no planarization process is performed to provide the exemplary semiconductor structure shown in FIG. 9.

Figure 10:
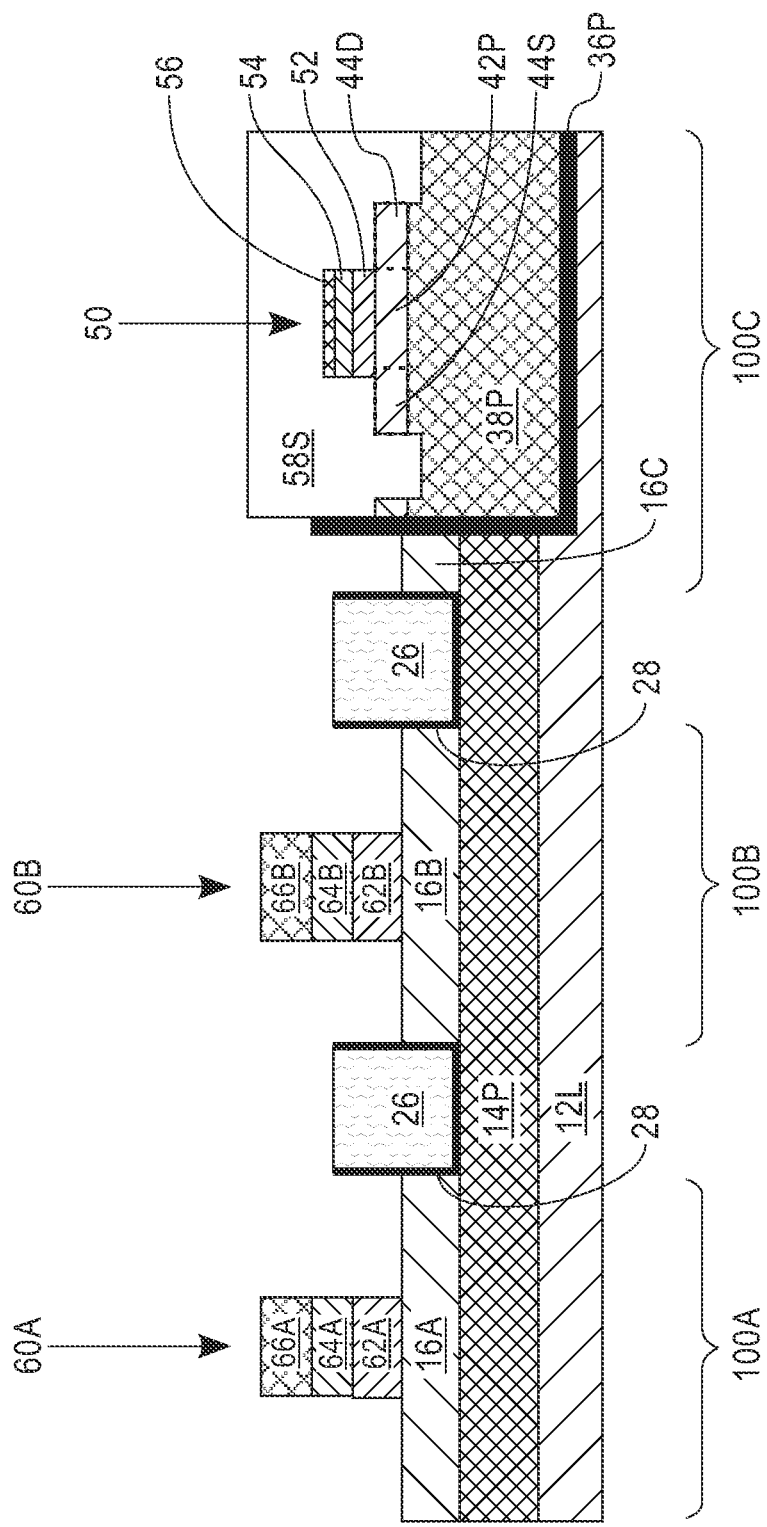
FIG. 10 is a cross sectional view of the exemplary semiconductor structure of FIG. 9 after forming an nFET gate stack on a portion of the topmost silicon layer within the nFET device region and forming a pFET gate stack on a portion of the topmost silicon layer within the pFET device region.

Referring now to FIG. 10, there is illustrated the exemplary semiconductor structure of FIG. 9 after forming an nFET gate stack 60A on a portion of the topmost silicon layer 16A within the nFET device region 100A and forming a pFET gate stack 60B on a portion of the topmost silicon layer 60B within the pFET device region 100B. A remaining portion of the oxide layer 58 (i.e., oxide hard mask portion 58P) protects the Group III nitride device region 100C during the formation of the nFET gate stack 60A and the pFET gate stack 60B. Notably, and prior to processing the nFET device region 100A or the pFET device region 110B, the oxide layer 58 and the remaining portion of the another hard mask layer 30P are removed from the both nFET device region 100A and the pFET device region 100B, while maintaining a portion of oxide layer 58 within the Group III nitride device region 100C. This step of the present application includes lithography and etching. After removing the oxide layer 58 and the remaining portion of the another hard mask layer 30P from the both nFET device region 100A and the pFET device region 100B, the second hard mask layer 22A, 22B can be removed utilizing a selective etch that removes the second hard mask material that provides the second hard mask layer 22A, 22B.

The first hard mask layer 20A, 20B may remain prior to formation of the nFET gate stack 60A and the pFET gate stack 60B and serve as an implantation mask during the formation of well regions (not shown) into the topmost silicon layer 16A, 16B in each of the nFET gate stack 60A and the pFET gate stack 60B. As is known to those skilled in the art, a p-type well region is formed in the nFET device region 100A, while an n-type well region is formed in the pFET device region 100B. The order of forming the well regions into the topmost silicon layers 16A and 16B may vary. Following the formation of the well regions, the remaining portions of the first hard mask layer 20A and 20B can be removed and thereafter the nFET gate stack 60A and the pFET gate stack 60B can be formed. In one embodiment of the present application, the nFET gate stack 60A and the pFET gate stack 60B can be formed simultaneously, i.e., at the same time. In another embodiment of the present application, the nFET gate stack 60A is formed either prior to, or after, formation of the pFET gate stack 60B.

The nFET gate stack 60A includes, from bottom to top, an nFET gate dielectric portion 62A and an nFET gate conductor portion 64A. An optional nFET gate cap portion 66A can be present atop the nFET gate conductor portion 64A. The pFET gate stack 60B includes, from bottom to top, a pFET gate dielectric portion 64B and a pFET gate conductor portion 64B. An optional pFET gate cap portion 66B can be present atop the pFET gate conductor portion 64B.

The nFET gate dielectric portion 62A and the pFET gate dielectric portion 62B may include one of gate dielectric materials mentioned above for HEMT gate dielectric portion 52. In one embodiment, the nFET gate dielectric portion 62A comprises a same gate dielectric material as the pFET gate dielectric portion 62B. In another embodiment, the nFET gate dielectric portion 62A comprises a different gate dielectric material than the pFET gate dielectric portion 62B. When different gate dielectric materials are employed, block mask technology may be used.

The nFET gate conductor portion 64A and the pFET gate conductor portion 64B may include one of gate conductor materials mentioned above for HEMT gate conductor portion 54. In one embodiment, the nFET gate conductor portion 64A comprises a same gate conductor material as the pFET gate conductor portion 64B. In another embodiment, the nFET gate conductor portion 64A comprises a different gate conductor material than the pFET gate conductor portion 62B. When different gate conductor materials are employed, block mask technology may be used.

The nFET gate portion 66A and the pFET gate cap portion 66B include one of the gate cap materials mentioned above for HEMT gate cap 56.

In some embodiments of the present application, and as shown, the nFET gate stack 60A and the pFET gate stack 60B are both functional gate structures. The functional nFET and pFET gate stacks can be formed as described above in forming the functional HEMT gate structure 50. In some embodiments, at least one of the nFET gate stack 60A and the pFET gate stack 60B is a sacrificial gate structure that is replaced with a corresponding functional gate structure after the source/drain regions have been formed.

The source/drain regions for the nFET gate stack 60A and the pFET gate stack 60B can be formed either prior to, or after, forming the functional gate structure by ion implantation. For clarity, the source/drain regions for the nFET gate stack 60A and the pFET gate stack 60B are not shown in the drawings. However, and as is well known to those skilled in the art, the source/drain regions for the nFET gate stack 60A would be located within the topmost silicon layer 16A and at the footprint of the nFET gate stack 60A, while the source/drain regions for the pFET gate stack 60B would be located within the topmost silicon layer 16B and at the footprint of the pFET gate stack 60B. When sacrificial gate structures are formed, the source/drain regions for the source/drain regions nFET gate stack 60A and the pFET gate stack 60B would be formed at the footprint of the each gate structure. In some embodiments, the source/drain regions can be formed after forming the gate spacers as shown in FIG. 11.

Figure 11:
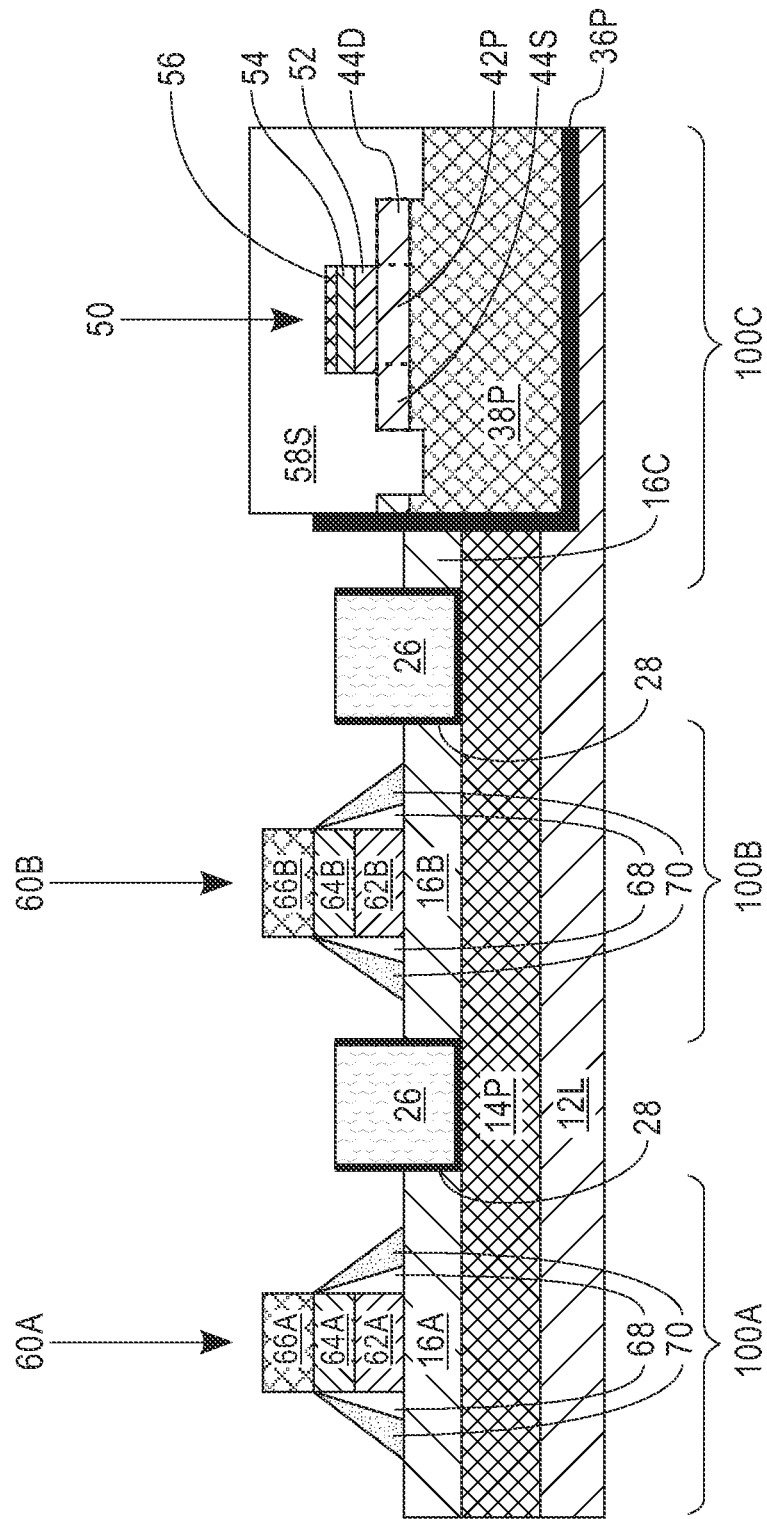
FIG. 11 is a cross sectional view of the exemplary semiconductor structure of FIG. 10 after forming gate spacers on the nFET gate stack and the pFET gate stack.

Referring to FIG. 11, there is illustrated the exemplary semiconductor structure of FIG. 10 after forming gate spacers 68, 70 on each of the nFET gate stack 60A and the pFET gate stack 60B. Although the present application describes and illustrates a pair of gate spacers 68, 70 formed about the nFET gate stack 60A and the pFET gate stack 60B, the present application contemplates embodiments in which only a single gate spacer is formed. The gate spacer 68 may be referred to an inner gate spacer, while gate spacer 70 may be referred to as an outer gate spacer. Gate spacers 68, 70 may comprise a same or different gate spacer material. Illustrative examples of gate spacer materials that can be used in providing the gate spacers 68, 70 comprise silicon dioxide, silicon nitride, and/or silicon oxynitride. Each gate spacer 68, 70 can be formed by deposition of a gate spacer material, and then patterning the gate spacer material utilizing an gate spacer etch. In one embodiment, gate spacer 68 comprises silicon nitride, while gate spacer 70 comprises silicon dioxide.

Figure 12:
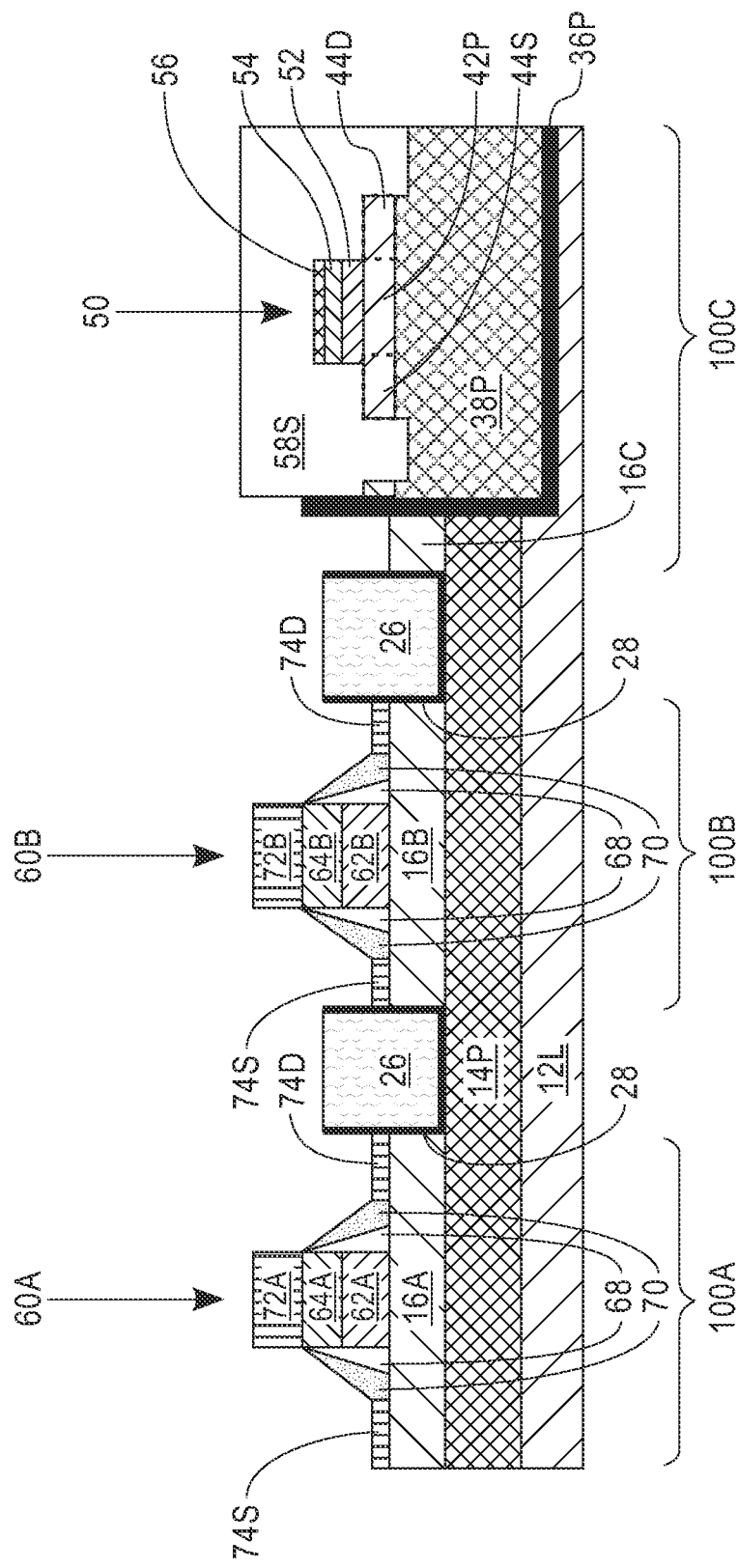
FIG. 12 is a cross sectional view of the exemplary semiconductor structure of FIG. 11 after forming metal semiconductor alloy contacts within the nFET region and the pFET device region.

Referring now to FIG. 12, there is illustrated the exemplary semiconductor structure of FIG. 11 after forming metal semiconductor alloy contacts 74S, 74D, 72A and 72B within the nFET device region 100A and the pFET device region 100B. In some embodiments of the present application, metal semiconductor alloy contacts 72A, 72B can be omitted. In the present application, metal semiconductor alloy contact 74S represents a source-side metal semiconductor alloy contact, metal semiconductor alloy contact 74D represents a drain-side metal semiconductor alloy contact, metal semiconductor alloy contact 72A represents an nFET gate metal semiconductor alloy contact, and metal semiconductor alloy contact 72B represents a pFET gate metal semiconductor alloy contact.

In some embodiments and when the gate conductor portion of the nFET and pFET gate stacks comprises polysilicon, the gate cap portions 66A, 66B are removed. In some embodiments, this step may be omitted. Next, a metal semiconductor alloy forming metal (not shown) such as, for example, nickel, platinum, palladium, titanium, cobalt, and/or tungsten, is formed over the structure by utilizing a deposition or co-deposition process. A diffusion barrier layer (not shown) such as, for example, TiN and/or TaN can then be formed atop the metal semiconductor alloy forming metal. An anneal that causes diffusion of metal and reaction of the diffused metal with underlying semiconductor portions of the structure can then be performed. A single anneal or multiple anneals can be performed. The anneal temperature may be from 550° C. or above. Following the anneal, the diffusion barrier and any non reacted metal semiconductor alloy forming metal can be removed utilizing selective etching processes. In one embodiment, metal semiconductor alloy contacts formed within the nFET device region 100A comprise a same metal semiconductor alloy as the metal semiconductor alloy contacts within the pFET device region 100B. Since silicon is used as the material for topmost silicon layer 16A and 16B, the source-side and drain-side metal semiconductor alloy contacts 74S, 74D formed in the nFET device region 100A and the pFET device region are metal silicides such as, for example, nickel silicide. The gate metal semiconductor alloy contacts 72A, 72B may be a metal silicide or a metal germanide.

Figure 13:
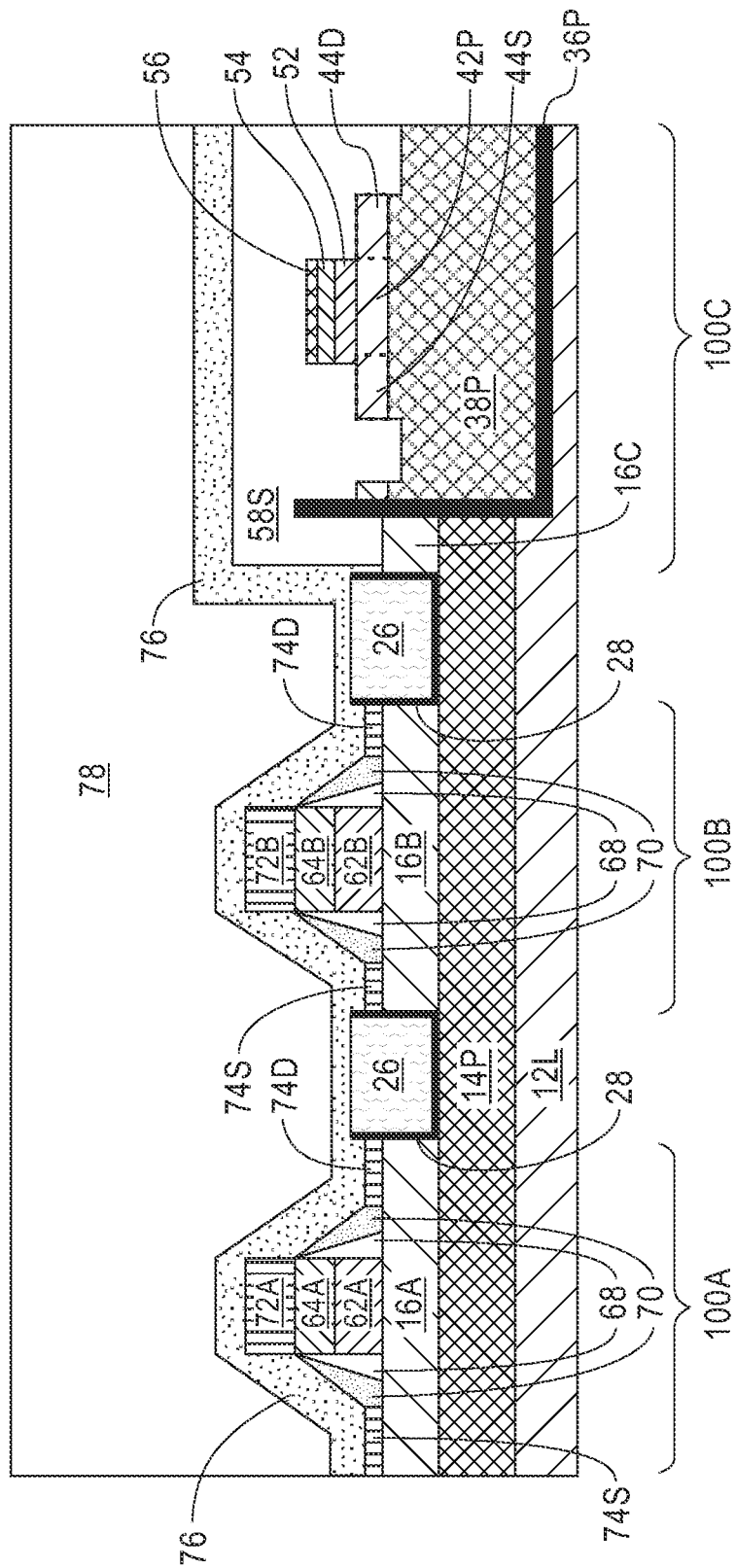
FIG. 13 is a cross sectional view of the exemplary semiconductor structure of FIG. 12 after forming a middle-of-the-line (MOL) liner and a MOL dielectric material.

Referring now to FIG. 13, there is illustrated the exemplary semiconductor structure of FIG. 12 after forming a middle-of-the-line (MOL) liner 76 and a MOL dielectric material 78. In some embodiments, the MOL liner 76 can be omitted. When present, the MOL liner 76 may comprise any dielectric liner material such as, for example, silicon nitride, silicon dioxide and/or silicon oxynitride. The MOL liner 76 can be formed utilizing a deposition process such as, for example, chemical vapor deposition, plasma enhanced chemical vapor deposition or physical vapor deposition. The thickness of the MOL liner 76 can be from 10 nm to 30 nm. Other thicknesses that are lesser than, or greater than, the aforementioned thickness range may also be used as the thickness of the MOL liner 76. In some embodiments and prior to forming the MOL liner the oxide structure 58 can be extended to be atop the remaining portion of the topmost silicon layer 16C in the Group III nitride device region 110C. The extension can be formed by depositing or thermal oxidation.

MOL dielectric material 78 may comprise a dielectric material that has a dielectric constant that is equal to, or less, than the dielectric constant of silicon dioxide. Illustrative examples of dielectric materials that can be employed as the MOL dielectric material 78 include silicon dioxide, silsesquioxanes, C doped oxides (i.e., organosilicates) that comprise, consist essentially of or consist of atoms of Si, C, 0 and H, thermosetting polyarylene ethers or multilayers thereof. The interconnect dielectric material 78 may be porous or non-porous. Porous dielectric materials are advantageous since such dielectric materials have a lower dielectric contact than an equivalent non-porous dielectric material.

The dielectric material that provides interconnect dielectric material 78 can be formed by a deposition process such as, for example, chemical vapor deposition, plasma enhanced chemical vapor deposition, evaporation or spin-on coating. The dielectric material that provides the MOL dielectric material 78 can have a thickness from 100 nm to 500 nm. Other thicknesses that are lesser than, or greater than, the aforementioned thickness range can also be employed as the thickness of the MOL dielectric material 78. In some embodiments, and following deposition of the dielectric material, a planarization process can be employed in forming the MOL dielectric material 78.

Figure 14:
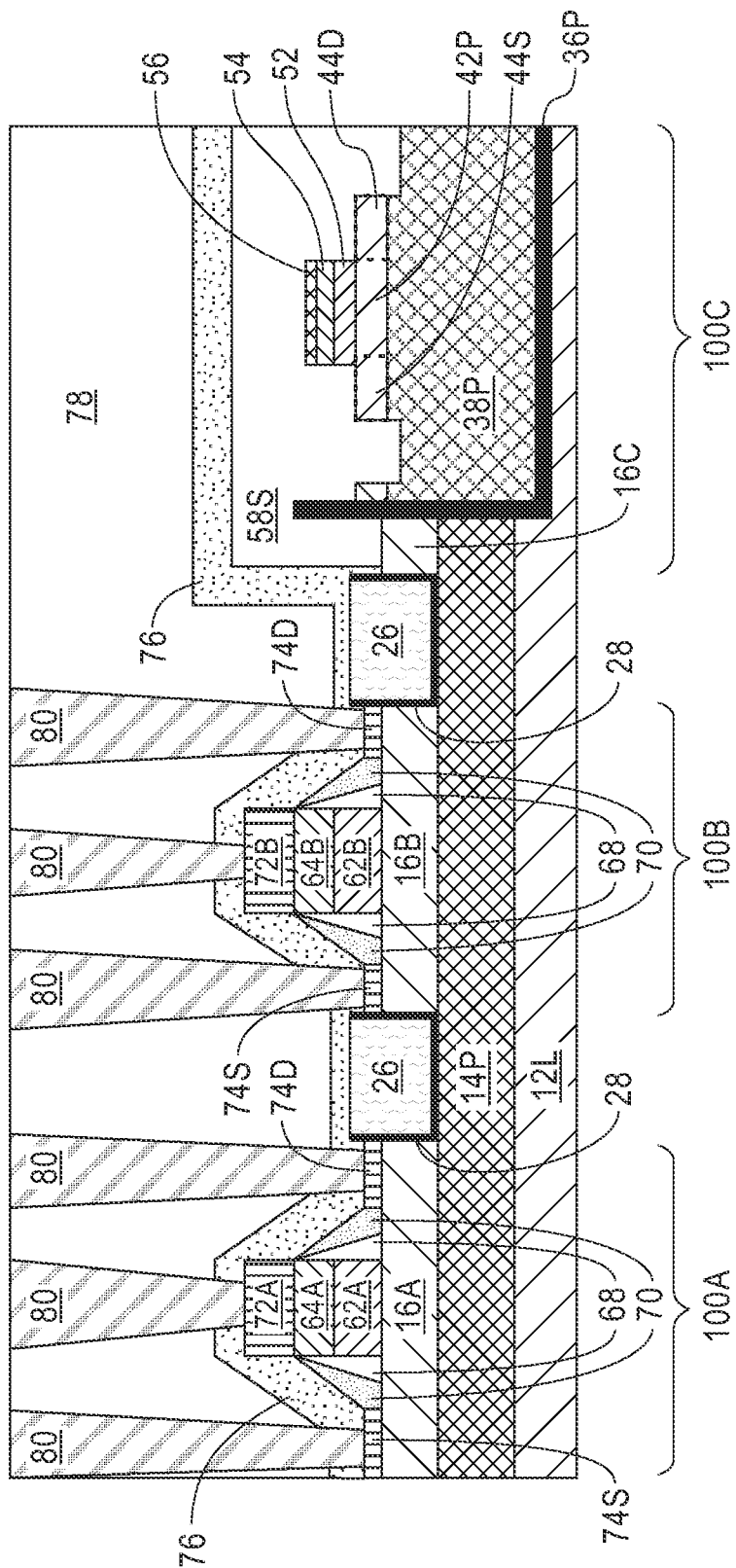
FIG. 14 is a cross sectional view of the exemplary semiconductor structure of FIG. 13 after forming metal contact structures within the nFET device region and the pFET device region.

Referring now to FIG. 14, there is illustrated the exemplary semiconductor structure of FIG. 13 after forming metal contact structures 80 within the nFET device region 100A and the pFET device region 100B. The metal contact structures 80 can be formed by first providing contact openings in the MOL dielectric material 78 and the MOL liner 76 that expose the various metal semiconductor alloy contacts 74S, 74D, 72A, 72B mentioned above. In some embodiments, contact openings to the top of the nFET and/or pFET gate stack may be omitted. The contact openings can be formed by lithography and etching. In some embodiments (not shown), a diffusion barrier liner such as, for example, TiN and/or TaN, is formed within each of the contact openings prior to contact metal formation. A contact metal such as, for example, tungsten, aluminum and/or copper can be formed into each contact opening utilizing a deposition process such as, for example, chemical vapor deposition, plasma enhanced chemical vapor deposition, or plating. A planarization process may follow the deposition of the contact metal and provide the contact structures 80 shown in FIG. 14.

Figure 15:
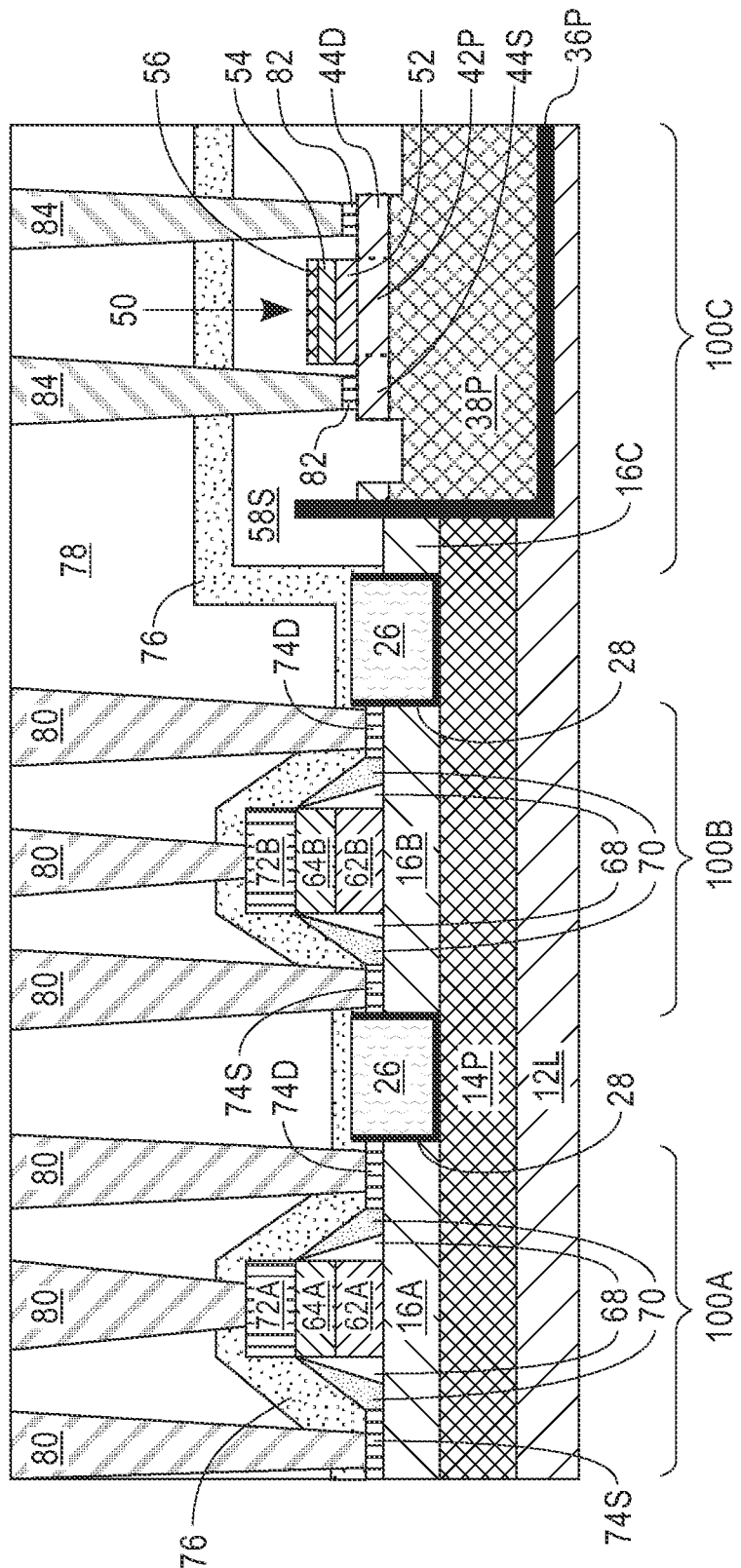
FIG. 15 is a cross sectional view of the exemplary semiconductor structure of FIG. 14 after forming metal contact structures within the Group III nitride device region that contact the source/drain regions located within end portions of the Group III nitride channel material.

Referring now to FIG. 15, there is illustrated the exemplary semiconductor structure of FIG. 14 after forming metal contact structures 84 within the Group III nitride device region 100C that contact the source/drain regions 44S/44D located within end portions of the Group III nitride channel material 42P. In such an embodiment, source/drain contacts 82 can be provided atop each of the source/drain regions 44S/44D. The source/drain contacts 82 may comprise a metal semiconductor alloy and can be formed as described above in forming the metal semiconductor alloy contacts. Source/drain contacts 82 can be omitted in the case when the structure shown in FIG. 7B is employed. The metal contact structures 84 can be formed as described above in forming the metal contact structures 80 within the nFET device region 100A and the pFET device region 100B. The metal contact structures 84 can be composed of one of the contact metals mentioned above for providing the metal contact structures 80.

Figure 16:
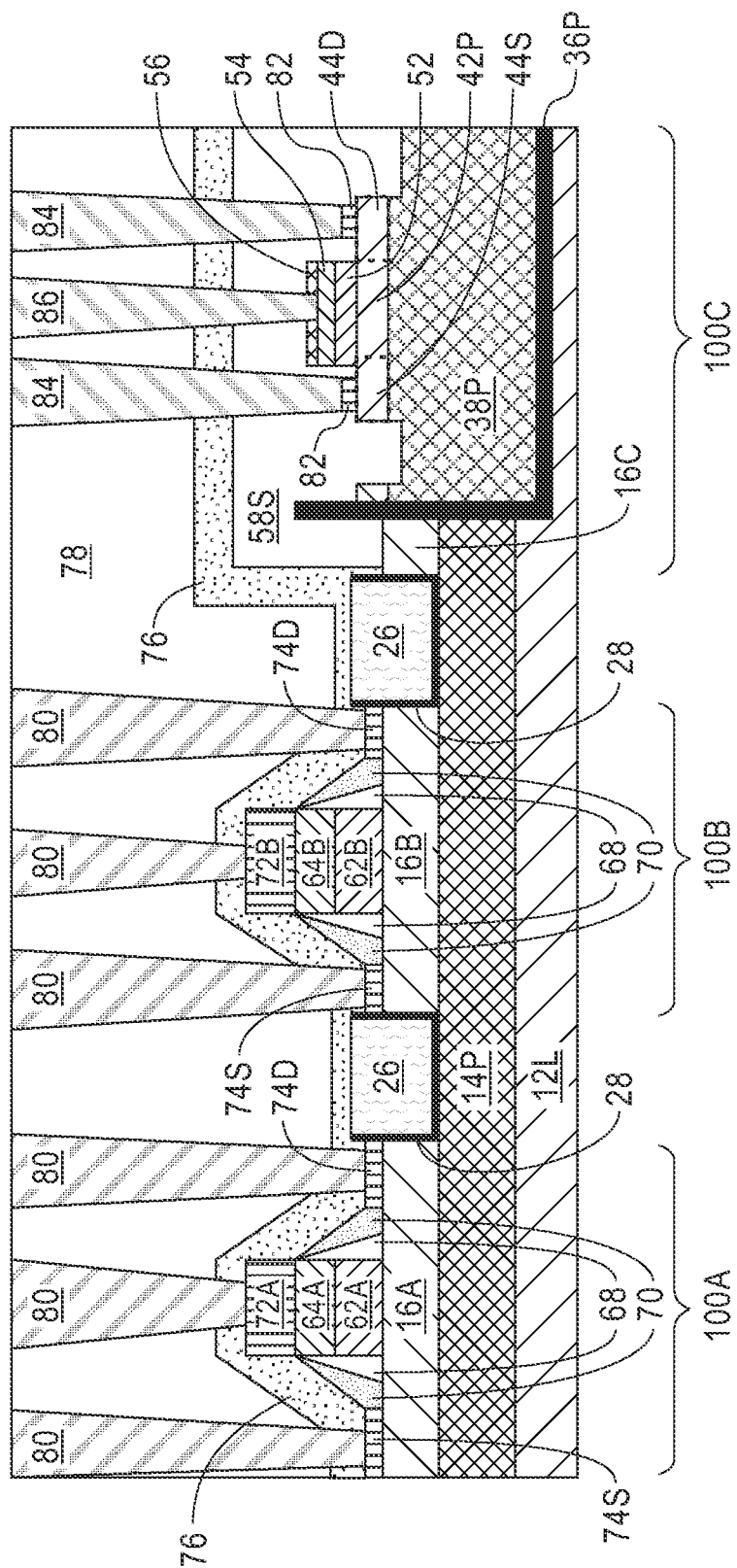
FIG. 16 is a cross sectional view of the exemplary semiconductor structure of FIG. 15 after forming a gate metal contact structure within the Group III nitride device region that contacts the topmost conductive surface of the gate structure.

Referring now to FIG. 16, there is illustrated the exemplary semiconductor structure of FIG. 15 after forming a gate metal contact structure 86 within the Group III nitride device region 100C that contacts the topmost conductive surface of the HEMT gate structure 50, i.e., HEMT gate conductor portion 54. In some embodiments of the present application, the formation of gate metal contact structure 86 may be omitted. Gate metal contact structure 86 can be formed as described above in forming the metal contact structures 80 within the nFET device region 100A and the pFET device region 100B. It is noted that the etch used to define the opening for the gate metal contact structure extends through HEMT gate gap portion 56. The metal contact structure 86 can be composed of one of the contact metal mentioned above for providing the metal contact structures 80.

Although the present application describes and illustrates the above sequence of forming metal contact structures 80, 84 and 86, the present application contemplates other embodiments in which the order of forming the various metal contact structures 80, 84 and 86 may vary from that described herein.

Figure 17:
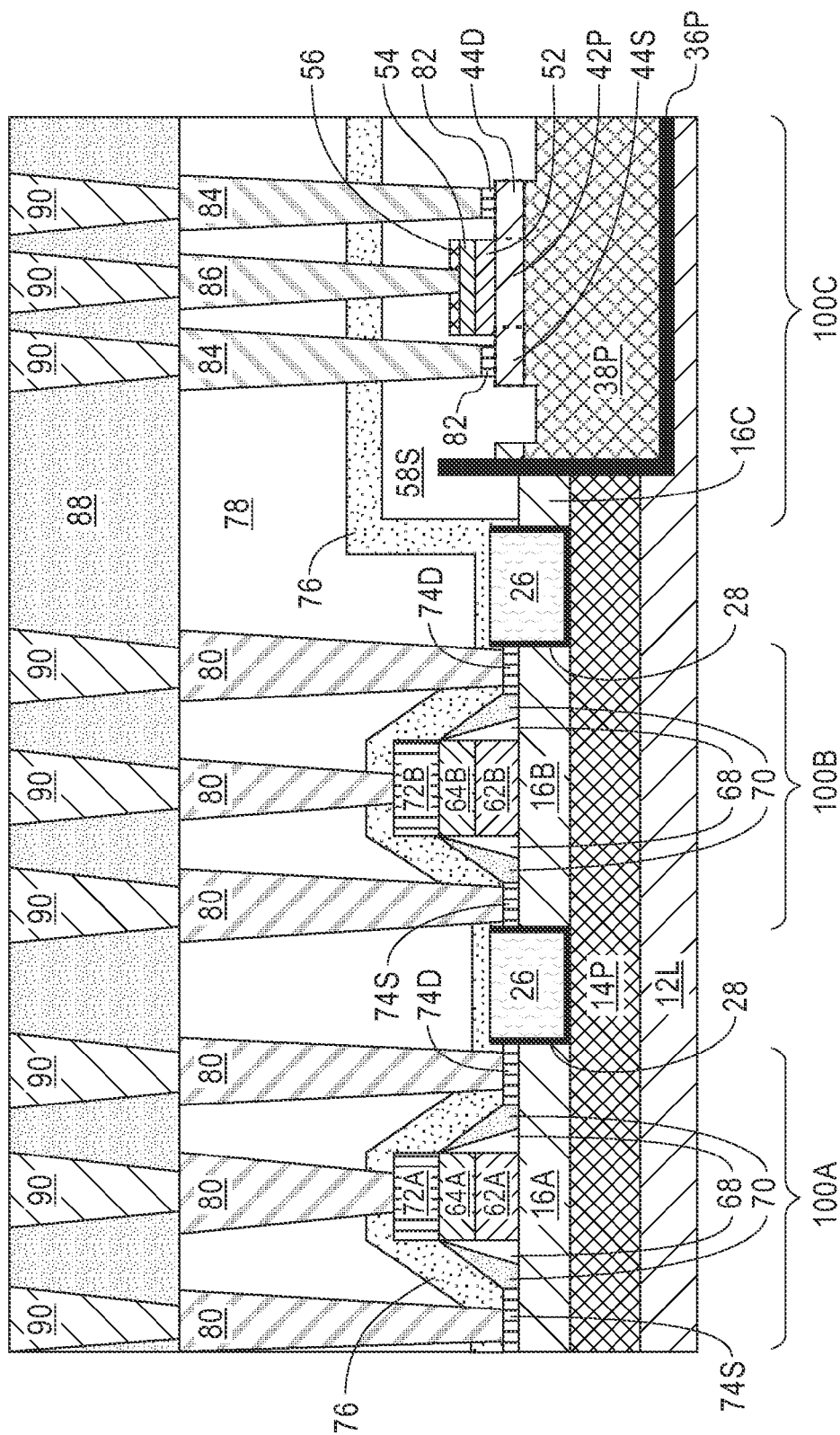
FIG. 17 is a cross sectional view of the exemplary semiconductor structure of FIG. 16 after forming an interconnect dielectric material containing interconnect metal structures embedded therein.

Referring now to FIG. 17, there is illustrated the exemplary semiconductor structure of FIG. 16 forming an interconnect dielectric material 88 containing interconnect metal structures 90 embedded therein. The interconnect dielectric material 88 may comprise one of the dielectric materials mentioned above for MOL dielectric material 78. In one embodiment of the present application, the interconnect dielectric material 88 comprises a same type of dielectric material as that which provides MOL dielectric material 78. In another embodiment of the present application, the interconnect dielectric material 88 comprises a different type of dielectric material than that which provides MOL dielectric material 78. The interconnect dielectric material 88 can be formed as described above in forming MOL dielectric material 78. The interconnect metal structures 90 can be formed utilizing the same processing as described above in forming metal contact structures 80. The interconnect metal structures 90 may comprise one of the metals mentioned above for providing the metal contact structures 80. In one embodiment, the interconnect metal structures 90 comprise a same metal as that of metal contact structures 80, 84, 86. In another embodiment, the interconnect metal structures 90 comprise a different metal as that used in providing the metal contact structures 80, 84, 86. A diffusion barrier liner not shown can be formed within the contact opening formed in the interconnect dielectric material 88 providing to providing the interconnect metal structures 90 within the contact openings.

It is noted that while the present application describes and illustrates the formation of the HEMT gate stack 50 prior to forming the nFET gate stack 60A and the pFET gate stack 60B, the present application also contemplates embodiments in which the nFET gate stacks and the pFET gate stacks are formed prior to forming the HEMT gate stack.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising;
a substrate containing an nFET device region, a pFET device region and a Group III nitride device region, wherein said nFET device region and said pFET device region comprise a topmost silicon layer of said substrate, and wherein said Group III nitride device region comprises a <111> silicon layer of said substrate, a Group III nitride material base material having a first band gap located atop a surface of said <111> silicon layer, and a Group III nitride channel material having a second band gap located on a mesa portion of said Group III nitride base material, wherein said second band gap is different from said first band gap and wherein said Group III nitride material base material has a topmost surface that is coplanar with, or below, a topmost surface of said topmost silicon layer, wherein a Group III nitride growth seed layer having a horizontal portion is located between said <111> silicon layer of said substrate and said Group III nitride base material, wherein said Group III nitride growth seed layer further comprises a vertical portion located on a sidewall surface of said Group III nitride base material.

2. The semiconductor structure of claim 1, further comprising an nFET gate stack located on said topmost silicon layer in said nFET device region, a pFET gate stack located on said topmost silicon layer in said pFET device region, and a high electron mobility transistor gate stack located on said Group III nitride channel material in said Group III nitride device region.

3. The semiconductor structure of claim 1, further comprising an insulator layer located beneath said topmost silicon layer in both said nFET device region and said pFET device region but not said Group III nitride device region, wherein said insulator layer is located on a portion of said <111> silicon layer.

4. The semiconductor structure of claim 1, wherein said nFET device region is separated from said pFET device region by a trench isolation structure and wherein said pFET device region is separated from said Group III nitride device region by another trench isolation structure.

5. The semiconductor structure of claim 1, further comprising a source/drain region located within each end portion of said Group III nitride channel material having said second band gap.

6. The semiconductor structure of claim 2, further comprising a middle-of-the-line (MOL) dielectric material surrounding said nFET gate stack, said pFET gate stack and said high electron mobility transistor gate stack, wherein said MOL dielectric material contains metal contacts that extend to source/drain regions present at the footprint of each of said nFET gate stack, said pFET gate stack and said high electron mobility transistor gate stack.

7. The semiconductor structure of claim 1, wherein Group III nitride base material has a thickness below 1.5 µm with a nominal patterned density of 50% or less.

\* \* \* \* \*